United States Patent
Noda

(10) Patent No.: US 7,342,821 B1
(45) Date of Patent: Mar. 11, 2008

(54) HOT-CARRIER-BASED NONVOLATILE MEMORY UTILIZING DIFFERING TRANSISTOR STRUCTURES

(75) Inventor: Kenji Noda, Fukuoka (JP)

(73) Assignee: Nscore Inc., Fukuoka (JP)

( * ) Notice: Subject to any disclaimer, the term of this patent is extended or adjusted under 35 U.S.C. 154(b) by 0 days.

(21) Appl. No.: 11/518,066

(22) Filed: Sep. 8, 2006

(51) Int. Cl.
*G11C 11/00* (2006.01)

(52) U.S. Cl. ............ 365/154; 365/189.05; 365/185.18; 365/185.03

(58) Field of Classification Search ................ 365/154, 365/189.05, 185.18, 185.03, 185.02
See application file for complete search history.

(56) References Cited

U.S. PATENT DOCUMENTS

| | | | |
|---|---|---|---|
| 3,636,530 A | 1/1972 | Mark et al. ................. | 365/228 |
| 4,419,744 A | 12/1983 | Rutter ......................... | 365/154 |
| 5,956,269 A | 9/1999 | Ouyang et al. ........ | 365/185.08 |
| 6,038,168 A | 3/2000 | Allen et al. ............ | 365/185.07 |
| 6,906,953 B2 | 6/2005 | Forbes .................. | 365/185.03 |
| 6,906,962 B2 | 6/2005 | Layman et al. ........ | 365/189.01 |
| 6,909,635 B2 | 6/2005 | Forbes et al. .......... | 365/189.01 |
| 6,963,509 B1 * | 11/2005 | Ju .......................... | 365/189.05 |

FOREIGN PATENT DOCUMENTS

| | | |
|---|---|---|
| JP | 06-076582 | 3/1994 |
| JP | 06-231587 | 8/1994 |
| WO | 2004/056721 A | 7/2004 |

* cited by examiner

*Primary Examiner*—David Lam
(74) *Attorney, Agent, or Firm*—Ladas & Parry, LLP

(57) ABSTRACT

A memory circuit includes a latch having a first node and a second node, a first MIS transistor operable to couple between the first node and a predetermined node, a second MIS transistor operable to couple between the second node and the predetermined node, and a control circuit configured to subject one of the first MIS transistor and the second MIS transistor to bias conditions that cause a lingering change in transistor characteristics thereof, wherein the MIS transistors of the latch have a lightly-doped-drain structure that includes first diffusion regions having a first impurity concentration and second diffusion regions having a second impurity concentration smaller than the first impurity concentration, and each of the first MIS transistor and the second MIS transistor has a doped diffusion region closest to a conduction channel with an impurity concentration different from the second impurity concentration.

14 Claims, 25 Drawing Sheets

FIG.5

|         | PL | RESTORE | WLW   | EQ    | WL | WE |
|---------|----|---------|-------|-------|----|----|
| WRITE   | 0  | 1       | 1     | 0     | 1  | 1  |
| READ    | 0  | 1       | 1     | 0     | 1  | 0  |
| STORE   | 1  | 1       | 1     | 0     | 0  | 0  |
| RESTORE | 0  | 0-0-1   | 0-1-0 | 0-1-1 | 0  | 0  |
| STANDBY | 0  | 1       | 1     | 0     | 0  | 0  |

HOT-CARRIER-BASED NONVOLATILE MEMORY UTILIZING DIFFERING TRANSISTOR STRUCTURES

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a nonvolatile memory cell (i.e., a basic unit of data storage) comprised of a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience an irreversible hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair. Such latch circuit and the pair of memory cell transistors together constitute a memory cell circuit, i.e., a basic unit of data storage.

The pair of memory cell transistors serving as nonvolatile data storage is not required to produce a large drain current, but are required to generate an irreversible hot-carrier effect in a short time with a low voltage stress applied thereto. Other MIS transistors used in the memory cell circuit, on the other hand, are required to allow a large drain current to flow, and are also required to be less susceptible to the hot carrier effect. In this manner, conflicting characteristics are required of the MIS transistors used in a single memory cell circuit.

Accordingly, there is a need for a memory cell circuit and nonvolatile semiconductor memory device that can satisfy the conflicting requirements for transistor characteristics between nonvolatile memory cell transistors and other transistors used in the memory cell circuit utilizing the hot carrier effect for nonvolatile data storage.

SUMMARY OF THE INVENTION

It is a general object of the present invention to provide a memory cell circuit and nonvolatile semiconductor memory device that substantially obviate one or more problems caused by the limitations and disadvantages of the related art.

It is another and more specific object of the present invention to provide a memory cell circuit and nonvolatile semiconductor memory device that can satisfy the conflicting requirements for transistor characteristics between nonvolatile memory cell transistors and other transistors used in the memory cell circuit utilizing the hot carrier effect for nonvolatile data storage.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a memory cell circuit and nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a memory circuit, which includes a latch including MIS transistors, the latch having a first node and a second node configured to be bi-stable with a potential of the first node inverse to a potential of the second node, a first MIS transistor operable to electrically couple between the first node of the latch and a predetermined node, a second MIS transistor operable to electrically couple between the second node of the latch and the predetermined node, and a control circuit configured to subject, in a first operation mode, one of the first MIS transistor and the second MIS transistor to bias conditions that cause a lingering change in transistor characteristics thereof, and to cause, in a second operation mode, the latch to store data responsive to the lingering change in the transistor characteristics, wherein at least one of the MIS transistors of the latch has a lightly-doped-drain structure that includes first diffusion regions having a first impurity concentration and second diffusion regions having a second impurity concentration smaller than the first impurity concentration, and each of the first MIS transistor and the second MIS transistor has a doped diffusion region closest to a conduction channel such that the doped diffusion region has an impurity concentration different from the second impurity concentration.

According to another aspect of the present invention, a semiconductor memory device includes a control circuit, word lines extending from the control circuit, word selecting lines extending from the control circuit, a plurality of memory units arranged in a matrix, one of the memory units coupled to a first bit line and a second bit line, the one of the memory units including, a latch including MIS transistors, the latch having a first node and a second node configured to be bi-stable with a potential of the first node inverse to a potential of the second node, a first MIS transistor having one of source/drain nodes thereof coupled to the first node of the latch, another one of the source/drain nodes thereof coupled to a predetermined node, and a gate node thereof coupled to the word selecting line, a second MIS transistor having one of source/drain nodes thereof coupled to the second node of the latch, another one of the source/drain nodes thereof coupled to the predetermined node, and a gate node thereof coupled to the word selecting line, a third transistor having a gate thereof coupled to one of the word lines and source/drain nodes thereof coupled to the first node and the first bit line, respectively, and a fourth transistor having a gate thereof coupled to the one of the word lines and source/drain nodes thereof coupled to the second node and the second bit line, respectively, wherein the control circuit of configured to subject, in a first operation mode, one of the first MIS transistor and the second MIS transistor to bias conditions that cause a lingering change in transistor characteristics thereof, and to cause, in a second operation mode, the latch to store data responsive to the lingering change in the transistor characteristics, and wherein at least one of the MIS transistors of the latch has a lightly-doped-drain structure that includes first diffusion regions having a first impurity concentration and second diffusion regions having a second impurity concentration smaller than the first impurity concentration, and each of the first MIS transistor and the second MIS transistor has a doped diffusion region closest to a conduction channel such that the doped diffusion region has an impurity concentration different from the second impurity concentration.

BRIEF DESCRIPTION OF THE DRAWINGS

Other objects and further features of the present invention will be apparent from the following detailed description when read in conjunction with the accompanying drawings, in which:

FIG. 5 is a table chart showing the signal levels of control signals that are defined with respect to each operation;

DESCRIPTION OF THE PREFERRED EMBODIMENTS

In the following, embodiments of the present invention will be described with reference to the accompanying drawings.

Figure 1:
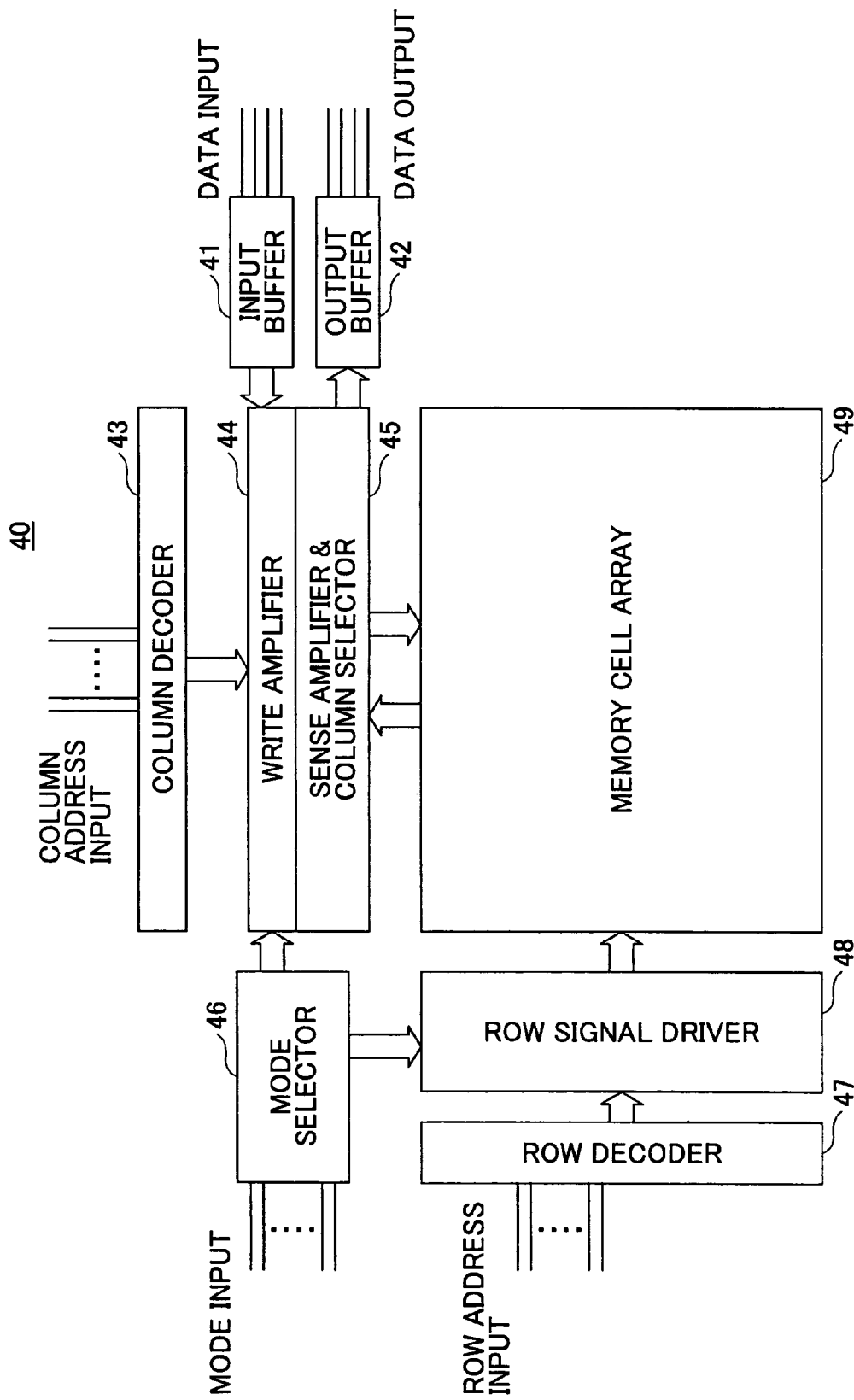
FIG. 1 is a block diagram showing the configuration of a nonvolatile semiconductor memory device according to the present invention.

FIG. 1 is a block diagram showing the configuration of a nonvolatile semiconductor memory device according to the present invention. A semiconductor memory device 40 shown in FIG. 1 includes an input buffer 41, an output buffer 42, a column decoder 43, a write amplifier 44, a sense amplifier & column selector 45, a mode selector 46, a row decoder 47, a row signal driver 48, and a memory cell array 49.

The memory cell array 49 includes a plurality of memory cells arranged in a matrix form, each memory cell including a volatile memory unit and a nonvolatile memory unit, as will later be described. The memory cells arranged in the same column are connected to the same bit lines, and the memory cells arranged in the same row are connected to the same word line.

The mode selector 46 receives mode input signals from an exterior of the device, and decodes the mode input signal to determine an operation mode (e.g., a write operation mode or a read operation mode). Control signals responsive to the determined operation mode are supplied to the write amplifier 44, the sense amplifier & column selector 45, the row signal driver 48, etc., for control of the individual parts of the semiconductor memory device 40.

The column decoder 43 receives a column address input from the exterior of the device, and decodes the column address input to determine a selected column. The decode signals indicative of the selected column are supplied to the write amplifier 44 and the sense amplifier & column selector 45.

The row decoder 47 receives a row address input from the exterior of the device, and decodes the row address input to determine a selected row. The decode signals indicative of the selected row are supplied to the row signal driver 48.

In response to the control signals from the mode selector 46 and the decode signals from the row decoder 47, the row signal driver 48 activates a selected word line among the word lines extending from the row signal driver 48. As a result of the activation of the selected word line, a volatile memory unit (i.e., latch circuit) of a memory cell circuit is coupled to a corresponding bit line pair among a plurality of bit line pairs. Through this coupling, the writing/reading of data to/from the volatile memory unit of the memory cell circuit is performed.

In response to the control signals from the mode selector 46 and the decode signals from the column decoder 43, the sense amplifier & column selector 45 couples bit lines corresponding to the selected column to a data bus. Through this coupling, data is transferred between the memory cell array 49 and the data bus. The sense amplifier & column selector 45 amplifies the data read from the memory cell array 49 for provision to the output buffer 42. The data is output from the output buffer 42 to the exterior of the device as output data. Input data supplied to the input buffer 41 is provided to the write amplifier 44. The write amplifier 44 amplifies the input data to be written to the memory cell array 49.

Figure 2:
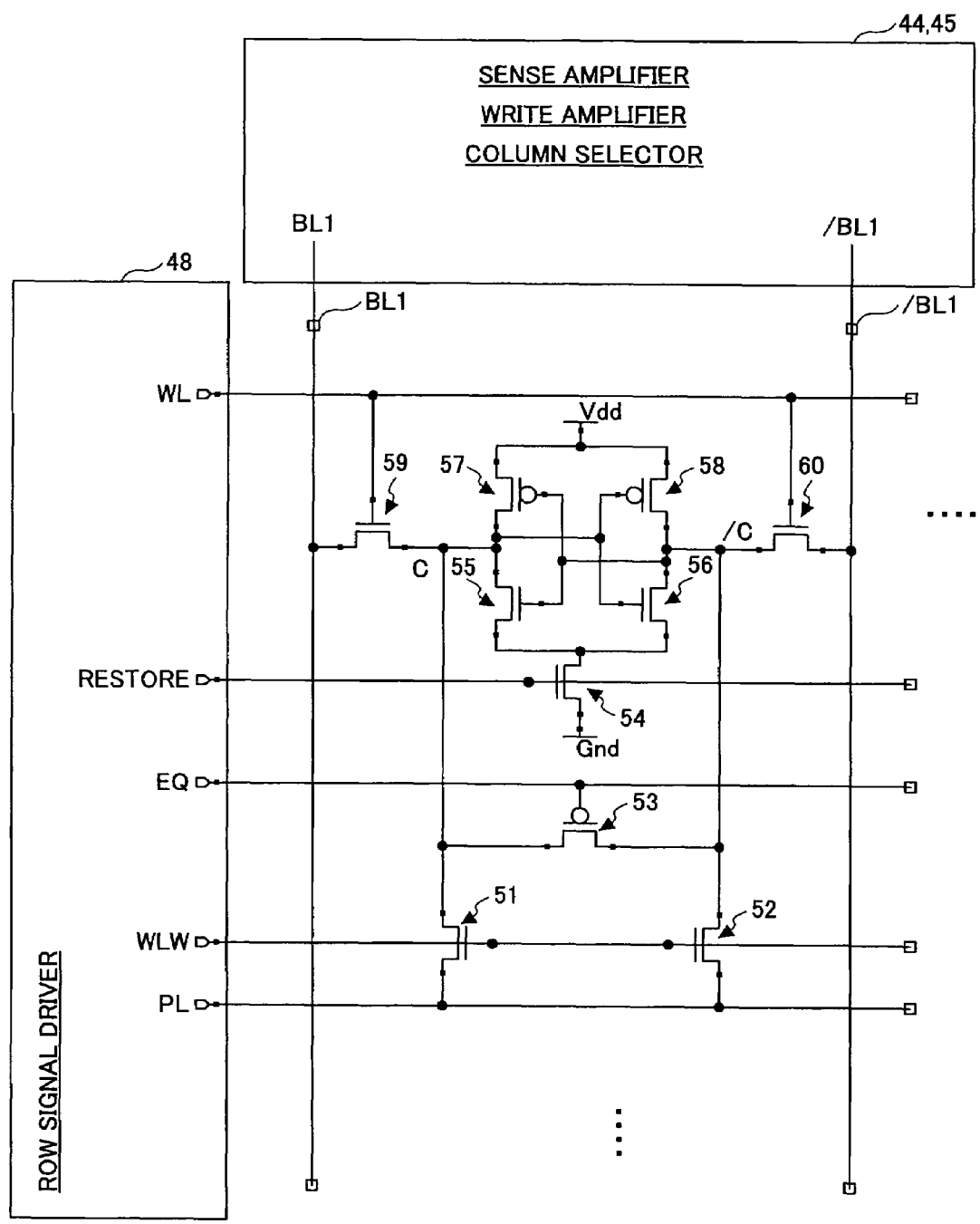
FIG. 2 is an illustrative drawing showing the configuration of a memory cell of the nonvolatile memory device according to the present invention.

FIG. 2 is an illustrative drawing showing the configuration of a memory cell of the nonvolatile memory device according to the present invention.

The memory cell includes NMOS transistors 51 and 52, a PMOS transistor 53, NMOS transistors 54 through 56, PMOS transistors 57 and 58, and NMOS transistors 59 and 60. The NMOS transistors 54 and 56 and PMOS transistors 57 and 58 together constitute a volatile memory unit. The NMOS transistors 51 and 52 together constitute a nonvolatile memory unit.

In FIG. 2, the nonvolatile memory unit according to the present invention is comprised of n-channel silicon MOS transistors as a non-limiting example. Other MIS (metal-insulating film-semiconductor) transistors such as p-channel silicon MOS transistors may as well be used to form the nonvolatile memory unit according to the present invention.

The NMOS transistors 51 and 52 serving as nonvolatile memory cell transistors have a different structure than the other NMOS transistors including the NMOS transistors 54 through 56 used in the volatile memory unit and the NMOS transistors 59 and 60 used as transfer gates between the memory cell and the bit lines. Further, it is preferable to manufacture all the MOS transistors of the memory cell with the same thickness of the gate oxide film. Namely, all the MOS transistors shown in FIG. 2 may be designed to operate with the same operating voltage (e.g., 1.8 V).

As shown in FIG. 2, bit lines BL1 and /BL1 extend from the write amplifier 44 and the sense amplifier & column selector 45, and are coupled to the volatile memory unit via the NMOS transistors 59 and 60 serving as a data transfer unit. A word selecting line WLW extends from the row signal driver 48, and is coupled to the gate nodes of the NMOS transistors 51 and 52 serving as the nonvolatile memory unit. A word line WL extends from the row signal driver 48 to be connected to the gates of the NMOS transistors 59 and 60. Further, a restore line RESTORE, plate line (controlled-power line) PL, and equalize line EQ also extend from the row signal driver 48.

It should be noted that the configuration shown in FIG. 2 is identical with respect to each and every one of the memory cells provided in the memory cell array 49. Namely, multiple sets of the lines RESTORE, PL, WLW, EQ, and WL are provided in one-to-one correspondence to the rows of the memory cell array 49.

Figure 3:
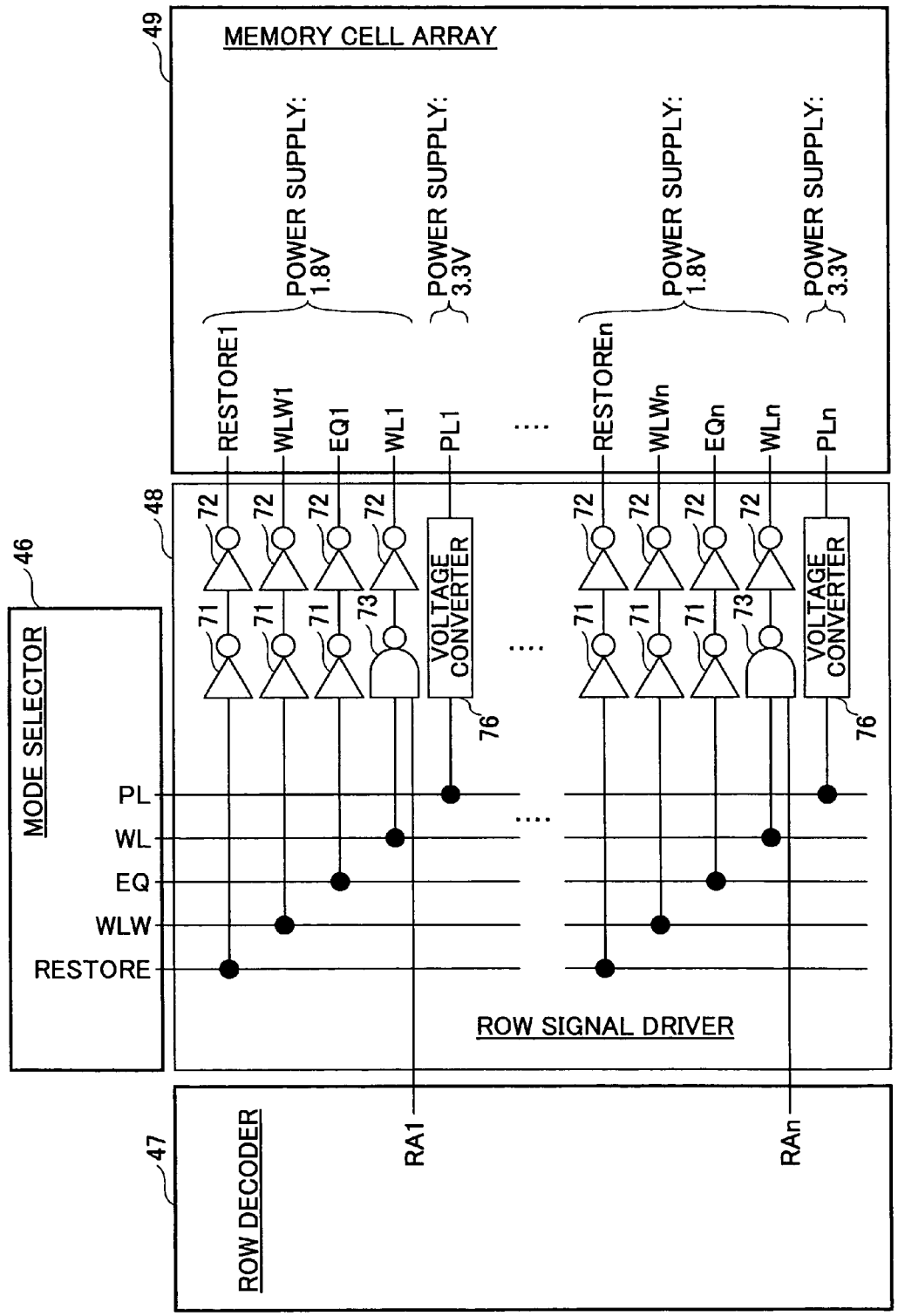
FIG. 3 is a drawing showing multiple sets of lines extending from a row signal driver and their relations with a mode selector and a row decoder.

FIG. 3 is a drawing showing the multiple sets of the lines extending from the row signal driver 48 and their relations with the mode selector 46 and the row decoder 47. In this configuration, store operation (storing data from the volatile memory unit to the nonvolatile memory unit) and restore operation (reading data from the nonvolatile memory unit to the volatile memory unit) are performed with respect to the entirety of the memory cell array 49, rather than performed on a row-address-specific basis. Read/write operations of the volatile memory unit with respect to the bit lines BL1 and /BL1 are of course performed on a row-address-specific basis.

As shown in FIG. 3, the mode selector 46 supplies signals RESTORE, WLW, EQ, WL, and PL to the row signal driver 48. The signals RESTORE, WLW, EQ, and PL are coupled to the corresponding lines of each row without any logic operation, and are thus output from the row signal driver 48 to the memory cell array 49 as RESTORE1, WLW1, EQ1, and PL1 for a row address RA1 and RESTOREn, WLWn, EQn, and PLn for a row address RAn, for example. Inverters 71 and 72 are used as output buffers for RESTORE, EQ, and WLW, and voltage converters 76 are used for PL. The voltage converters 76 serve to covert the voltage of the signal PL to the voltage of the signal PLx (x=1, . . . n). Namely, with the use of the voltage converters 76, the row signal driver 48 can apply a high voltage (Vpp) to the plate line PL (see FIG. 2) at the time of store operation.

The signal WL supplied from the mode selector 46 and each row address signal are combined by a corresponding NAND gate 73, an output of which is inverted by the inverter 72 for provision to the memory cell array 49. Thus, only one of the signals WL1 through WLn is activated and supplied to the memory cell array 49 so as to activate a selected row address.

In this configuration, as described above, the store operation and restore operation are performed with respect to the entirety of the memory cell array 49. Alternatively, the store operation and restore operation may be performed separately for each row address. In such a case, the signals RESTORE, WLW, EQ, and PL supplied from the mode selector 46 are combined with each row address signal in the row signal driver 48 such as to achieve a proper row-address-specific store operation and restore operation.

Figure 4:
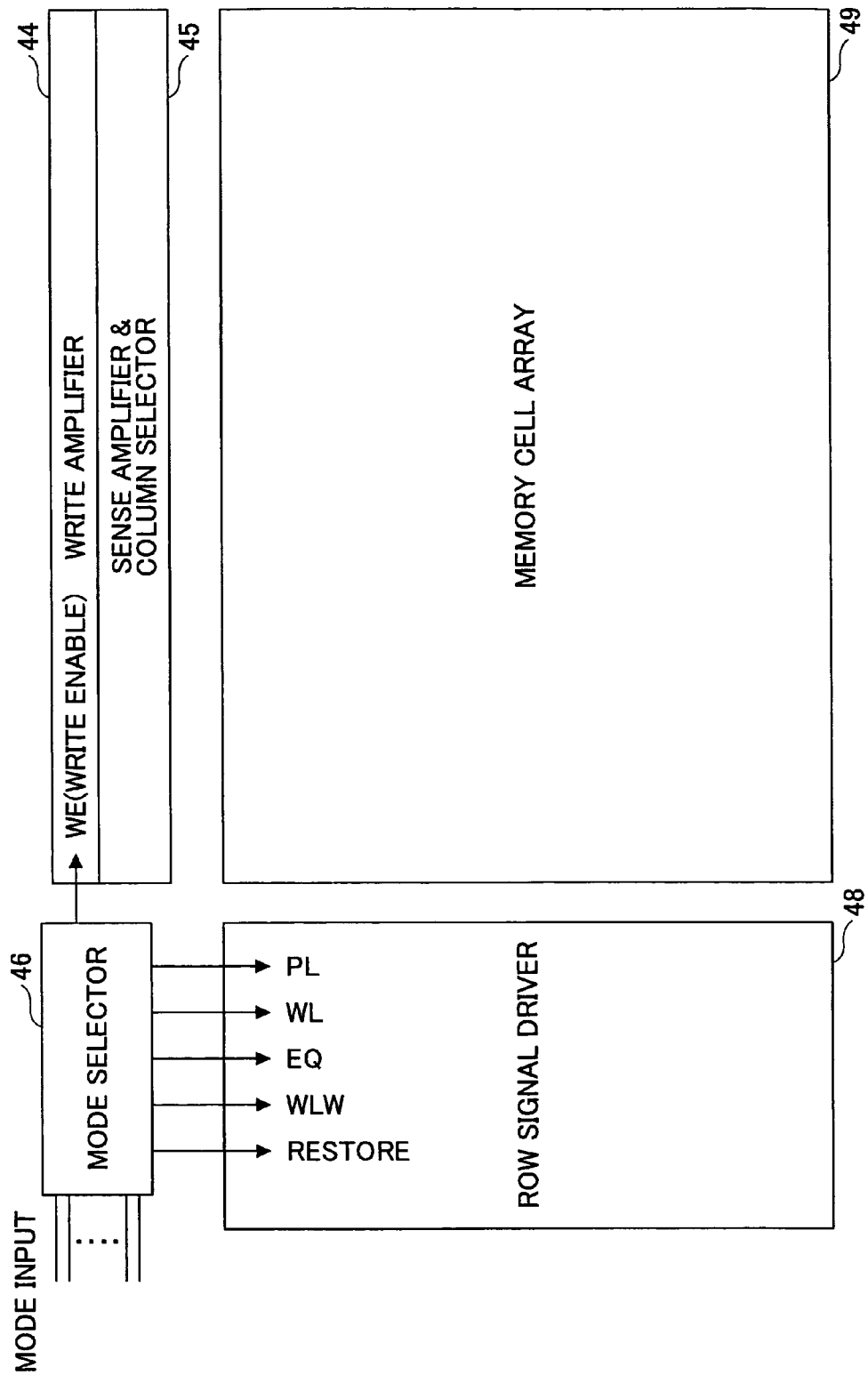
FIG. 4 is a drawing showing the flow of control signals output from the mode selector.

FIG. 4 is a drawing showing the flow of control signals output from the mode selector 46. As shown in FIG. 4, the mode selector 46 receives and decodes the mode input signals, and supplies various control signals to the row signal driver 48 and the write amplifier 44. Specifically, the control signals RESTORE, WLW, EQ, WL, and PL are supplied to the row signal driver 48, and a write enable signal WE is supplied to the write amplifier 44.

FIG. 5 is a table chart showing the signal levels of the control signals that are defined with respect to each operation. The columns of the table correspond to the respective control signals PL, RESTORE, WLW, EQ, WL, and WE, which are generated by the mode selector 46 in response to the mode input signals supplied from an exterior of the device. The rows of the table correspond to respective operations "Write", "Read", "Store", "Restore", and "Standby".

"Write" refers to the operation that writes data to the volatile memory unit. "Read" refers to the operation that reads data from the volatile memory unit. "Store" refers to the operation that writes data from the volatile memory unit to the nonvolatile memory unit. "Restore" refers to the operation that reads data from the nonvolatile memory unit to the volatile memory unit. "Standby" refers to the state in which data is maintained in the volatile memory unit.

The mode selector 46 sets the control signals to signal levels (signal states) as shown in the table of FIG. 5 in response to the mode input signals. Through such settings of the control signals, the mode selector 46 controls the write amplifier 44 and the row signal driver 48 to perform a requested operation with respect to the memory cell array 49.

Figure 6:
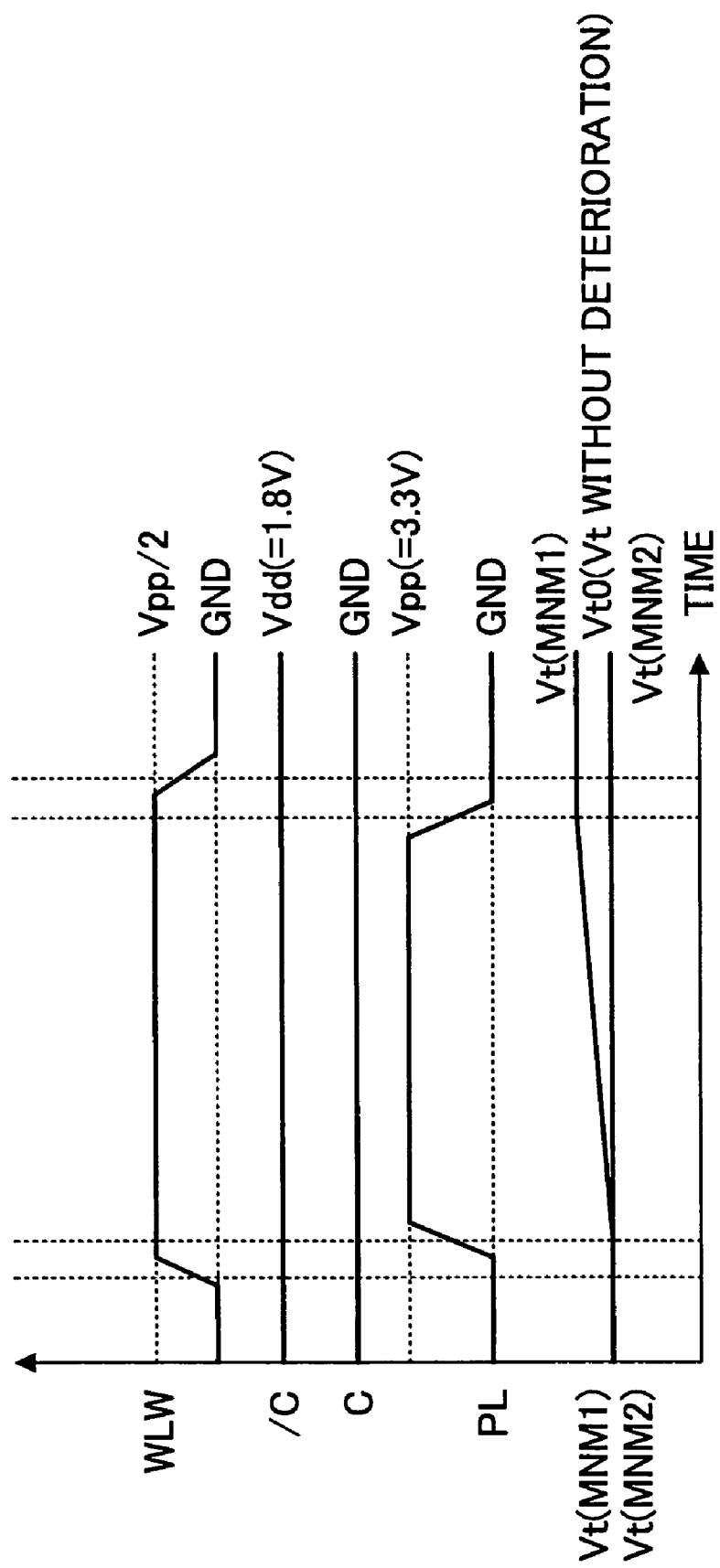
FIG. 6 is a signal waveform diagram for explaining a store operation of the nonvolatile memory device of the present invention.

FIG. 6 is a signal waveform diagram for explaining the store operation of the nonvolatile memory device of the present invention. When the mode input from the exterior of the device indicates a store operation, the control signals PL, RESTORE, WLW, EQ, WL, and WE are set to 1, 1, 1, 0, 0, and 0, respectively, as shown in FIG. 5. In response to PL being 1, the plate line PL is set to Vpp (=3.3 V), and in response to WLW being 1, the word selecting line WLW is set to Vpp/2, as shown in FIG. 6.

The potentials of the node C and the node /C are inverse to each other, and the data stored in the latch circuit (NMOS transistors 55 and 56 and PMOS transistors 57 and 58) determines which one of the nodes C and /C is HIGH.

In an example shown in FIG. 6, the node /C is HIGH (Vdd=1.8 V), and the node C is LOW (GND: ground). As a result, only the NMOS transistor 51 (denoted as MNM1 in FIG. 6) experiences a rise in the threshold voltage Vt. The NMOS transistor 52 (denoted as MNM2 in FIG. 6) does not experience a change in the threshold voltage Vt. This achieves the storing of the data of the volatile memory unit in the nonvolatile memory unit.

During the store operation as described above, the high potential (3.3 V) is never applied to the latch circuit. This is because the NMOS transistors 51 and 52 serve as intervening circuit elements between the plate line PL (Vpp=3.3 V) and the nodes C and /C. Since the word selecting line WLW is set to Vpp/2, and the nodes C and /C are serving as source nodes, the potentials at the nodes C and /C cannot exceed Vpp/2 minus the threshold voltage. In this configuration, therefore, a hot-carrier effect does not occur in the transistors used in the latch circuit. All the MIS transistors used in the memory cell (i.e., the MIS transistors 51 and 52 serving as memory cell transistors and the MIS transistors 54 through 58 constituting the latch circuit) can thus be properly designed to have the same thickness of the gate oxide film.

Figure 7:
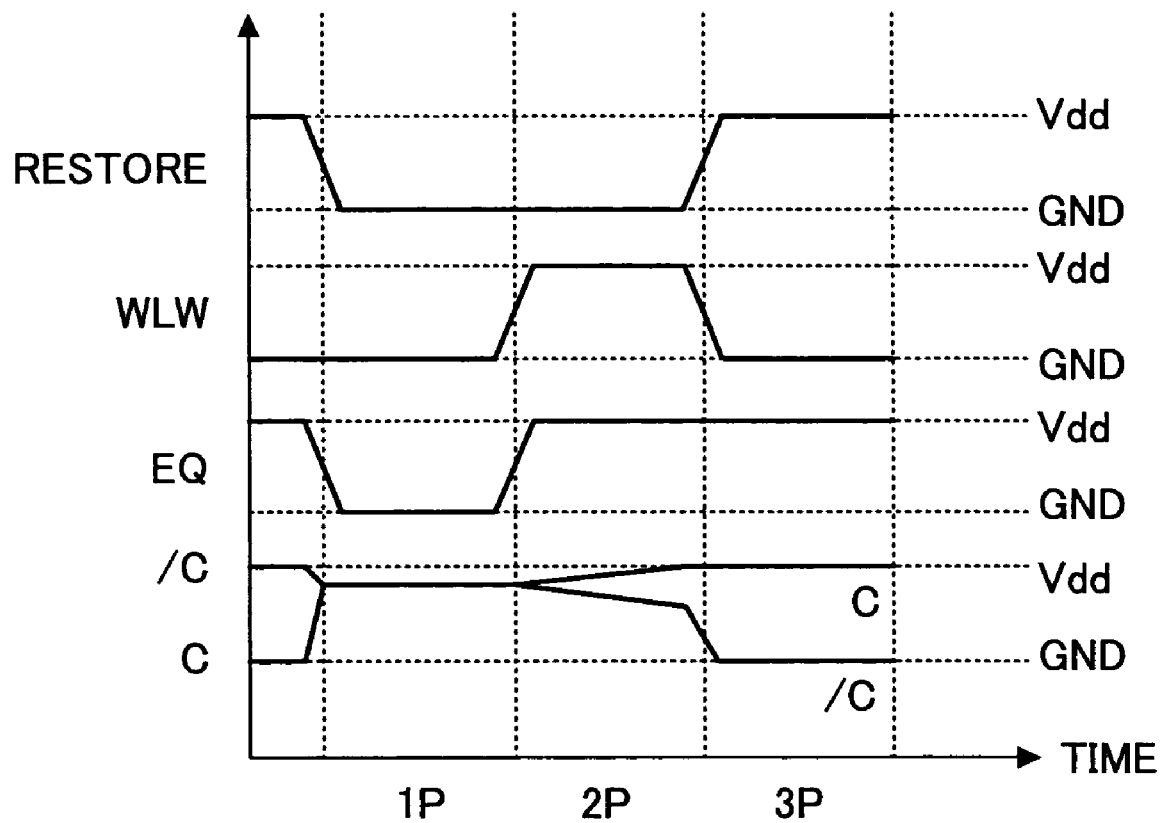
FIG. 7 is a signal waveform diagram for explaining a restore operation of the nonvolatile memory device according to the present invention.

FIG. 7 is a signal waveform diagram for explaining the restore operation of the nonvolatile memory device according to the present invention. When the mode input from the exterior of the device indicates a restore operation, the control signals PL, RESTORE, WLW, EQ, WL, and WE are set to 0, 0-0-1, 0-1-0, 0-1-1, 0, and 0, respectively, as shown in FIG. 5. Here, 0-1-0, for example, indicates that the signal level is set to 0 at the first phase, 1 at the second phase, and 0 at the third phase. The first, second, and third phases are shown in FIG. 7 as 1P, 2P, and 3P, respectively.

At the first phase 1P, the signal RESTORE is set to 0, and the signal EQ is set to 0. As a result, the NMOS transistor 54 in FIG. 2 becomes nonconductive to deactivate the volatile memory unit, and the PMOS transistor 53 in FIG. 2 becomes conductive to equalize the nodes C and /C. The equalization of the nodes C and /C is shown in FIG. 7 as occurring at the first phase 1P.

At the second phase 2P, the signal EQ is set to 1, and the word selecting line WLW is set to 1. As a result, the PMOS transistor 53 is turned off to separate the nodes C and /C from each other, and the NMOS transistors 51 and 52 are turned on. Assuming that the store operation as shown in FIG. 6 has been performed prior to the restore operation, the NMOS transistor 51 has a higher threshold voltage, and thus has a higher ON resistance. Accordingly, the force that pulls down the node C is weaker than the force that pulls down the node /C, resulting in the nodes C and /C changing to HIGH and LOW, respectively, as shown at the second phase 2P in FIG. 7.

At the third phase, the signal RESTORE is set to 1, and the word selecting line WLW is set to 0. As a result, the NMOS transistor 54 in FIG. 2 becomes conductive to activate the volatile memory unit, and the NMOS transistors 51 and 52 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 7.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

In the configuration shown in FIG. 2, a drain node and a source node used to apply a bias for generating the hot-carrier effect are swapped and used as a source node and a drain node, respectively, at the time of reading the data. With the swapping of the source and drain nodes at the time of "RESTORE" operation relative to the time of "STORE" operation, a change in the transistor characteristics caused by the hot-carrier effect is efficiently used as a means to store data.

In this manner, the configuration shown in FIG. 2 can detect and sense the data stored through a hot-carrier effect. It should be noted, however, that the HIGH/LOW levels of the electrical nodes C and /C are reversed between when the data is written and when the data is read. Because of this, there is a need to invert the data at the time of data writing or at the time of data reading. It should be noted, further, that the swapping of the source and drain nodes as described above is only an non-limiting example of a preferred embodiment, and such swapping may not be performed in other configurations according to the present invention.

In the following, a description will be given with respect to the use of transistors having different structures in the memory cell circuit of the present invention.

Figure 8:
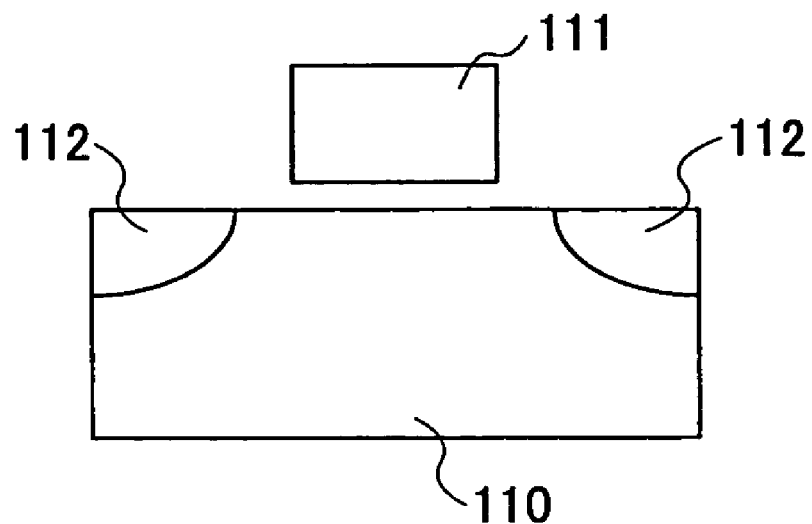
FIG. 8 is a drawing showing an example of the structure of an NMOS transistor used as a nonvolatile memory cell.
Figure 9:
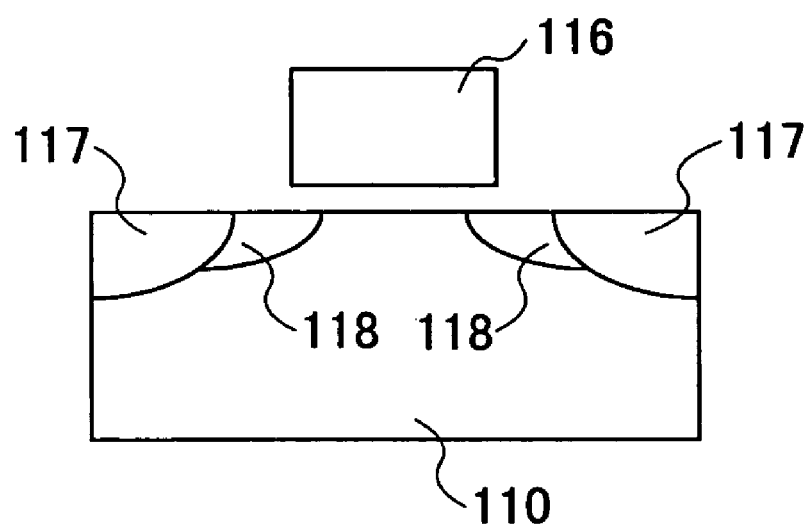
FIG. 9 is a drawing showing an example of the structure of an NMOS transistor used for purposes other than serving as a nonvolatile memory cell.

FIG. 8 is a drawing showing an example of the structure of an NMOS transistor used as a nonvolatile memory cell. FIG. 9 is a drawing showing an example of the structure of an NMOS transistor used for purposes other than serving as a nonvolatile memory cell. The structures shown in FIG. 8 and FIG. 9 are directed to a first embodiment of the present invention.

As shown in FIG. 8, an NMOS transistor used as nonvolatile memory cell is formed on a substrate 110, and includes a gate 111 and heavily doped diffusion regions 112. The heavily doped diffusion regions 112 have a high impurity concentration. An NMOS transistor having this structure is used as the NMOS transistors 51 and 52 shown in FIG. 2, i.e., as the nonvolatile memory cell transistors designed to experience the hot carrier effect.

As shown in FIG. 9, an NMOS transistor used for purposes other than serving as a nonvolatile memory cell is formed on the substrate 110, and includes a gate 116, heavily doped diffusion regions 117, and lightly doped diffusion regions 118. The heavily doped diffusion regions 117 have a high impurity concentration, and the lightly doped diffusion regions 118 have a low impurity concentration. An NMOS transistor having this structure is used as the NMOS transistors 54, 55, 56, 59, and 60 shown in FIG. 2, i.e., as the transistors that are not supposed to experience the hot carrier effect. Also, a PMOS transistor having the same structure as that shown in FIG. 9 with the opposite conductivity type is used as the PMOS transistors 53, 57, and 58 shown in FIG. 2, i.e., as the transistors that are not supposed to experience the hot carrier effect.

The transistor structure as shown in FIG. 9 is generally referred to as a LDD (lightly doped drain) structure, and is widely used for transistors having their gate lengths exceeding 0.5 micrometers. In the LDD structure, the heavily doped diffusion regions 117 and the lightly doped diffusion regions 118 are formed. The lightly doped diffusion regions 118 serve to relax the electric field in the transistor, so that the transistors having the LDD structure experience only a very weak hot carrier effect. A transistor having a single drain structure without lightly doped diffusion regions as shown in FIG. 8, on the other hand, tends to experience a strong hot carrier effect due to the lack of the mechanism to relax the electric field. It should be noted that, with respect to the transistor shown in FIG. 8, a doped diffusion region closest to the conduction channel (which is formed under the gate 111) has an impurity concentration different from that of the lightly doped diffusion regions 118.

In this embodiment of the present invention, LDD-structure transistors are used as the transistors 53 through 60 provided in the memory cell circuit for purposes other than serving as nonvolatile memory cell transistors, and single-drain-structure transistors are used as the transistors 51 and 52 serving as nonvolatile memory cell transistors. The use of signal-drain-structure transistors accelerates the hot-carrier-induced degradation of transistor characteristics.

Figure 10:
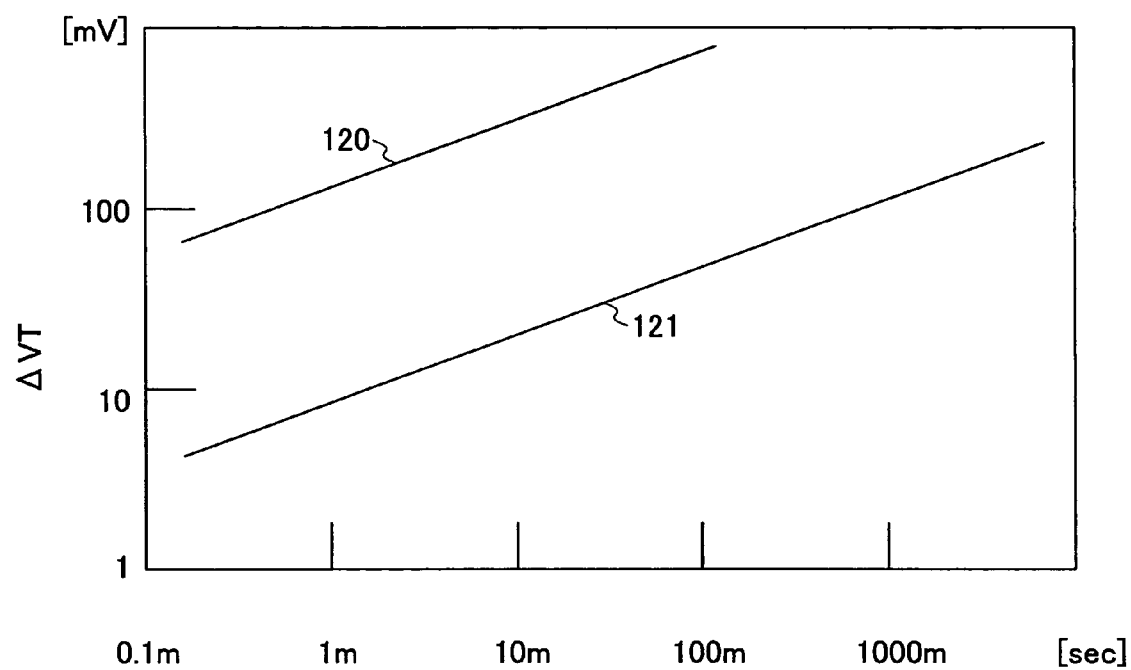
FIG. 10 is a diagram showing the relationship between the time spent on the writing of data and changes in a threshold voltage.

FIG. 10 is a diagram showing the relationship between the time spent on the writing of data and changes in the threshold voltage. In FIG. 10, the horizontal axis represents a logarithm of the length of a time [sec] that is spent writing data (applying a bias voltage) to a nonvolatile memory cell transistor, and the vertical axis represents a logarithm of a change in the threshold voltage [mV] caused by the hot-carrier effect. A characteristic line 120 illustrates a case in which a single-drain structure having only a heavily doped diffusion region is used as a nonvolatile memory cell transistor. A characteristic line 121 illustrates a case in which an LDD structure having both a heavily doped diffusion region and a lightly doped diffusion region is used as a nonvolatile memory cell transistor.

The hot carrier effect is caused when carriers in the transistor are highly energized by the electric current. The transistor having a LDD structure thus experiences a less hot carrier effect than the transistor having a single-drain structure as shown in FIG. 10. As can be seen from FIG. 10, the same amount of a threshold voltage change can be attained for the single-drain-structure transistor with approximately $1/100$ of the write time that is required for the LDD-structure transistor. That is, the use of single-drain-structure transistors as the nonvolatile memory cell transistors 51 and 52 in the memory cell circuit shown in FIG. 2 makes it possible to reduce the length of time required for data writing by a factor of $1/100$.

Figure 11A:
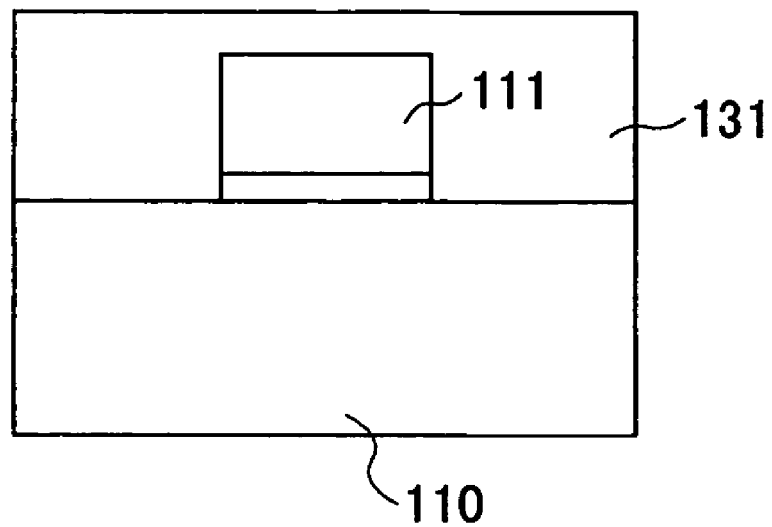
FIGS. 11A through 11D are drawings showing the process steps of producing a single-drain-structure transistor.
Figure 11B:
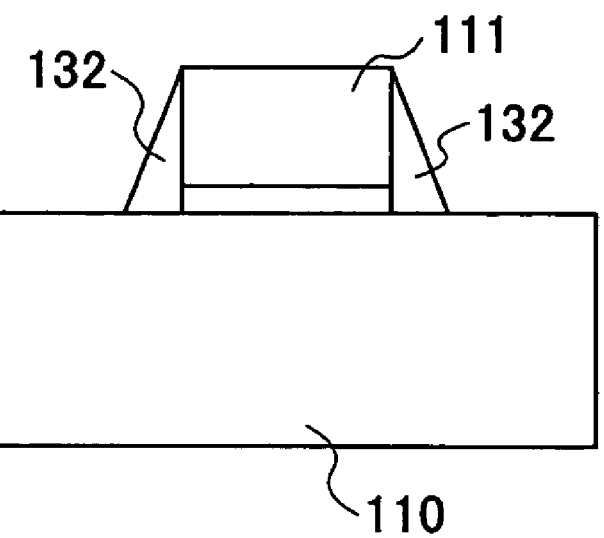
Figure 11C:
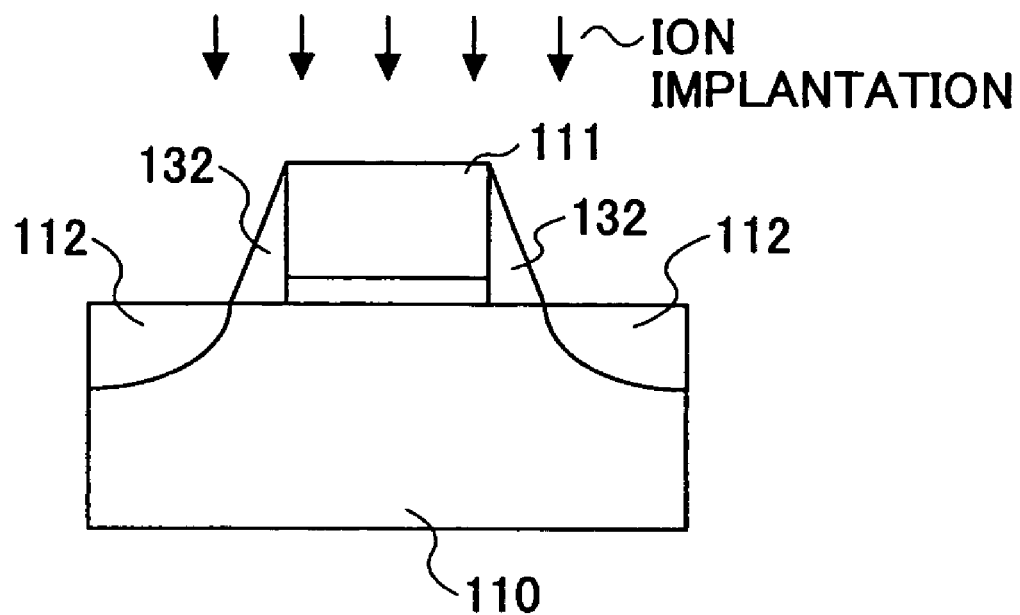
Figure 11D:
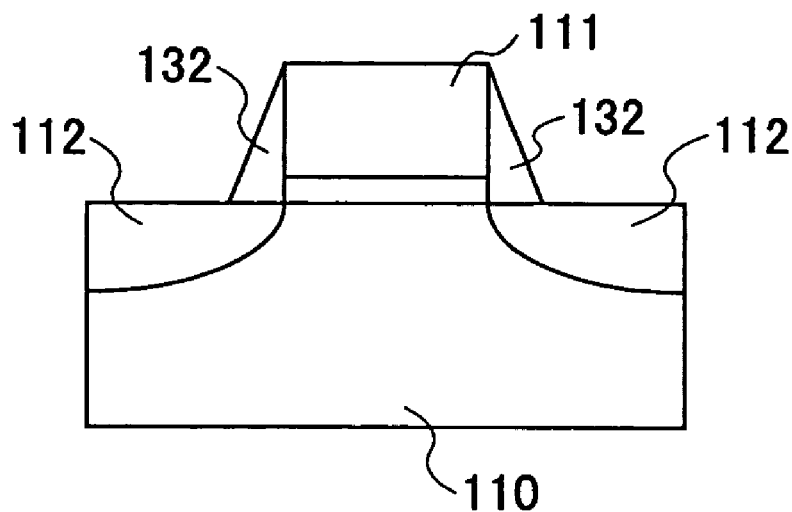
Figure 12A:
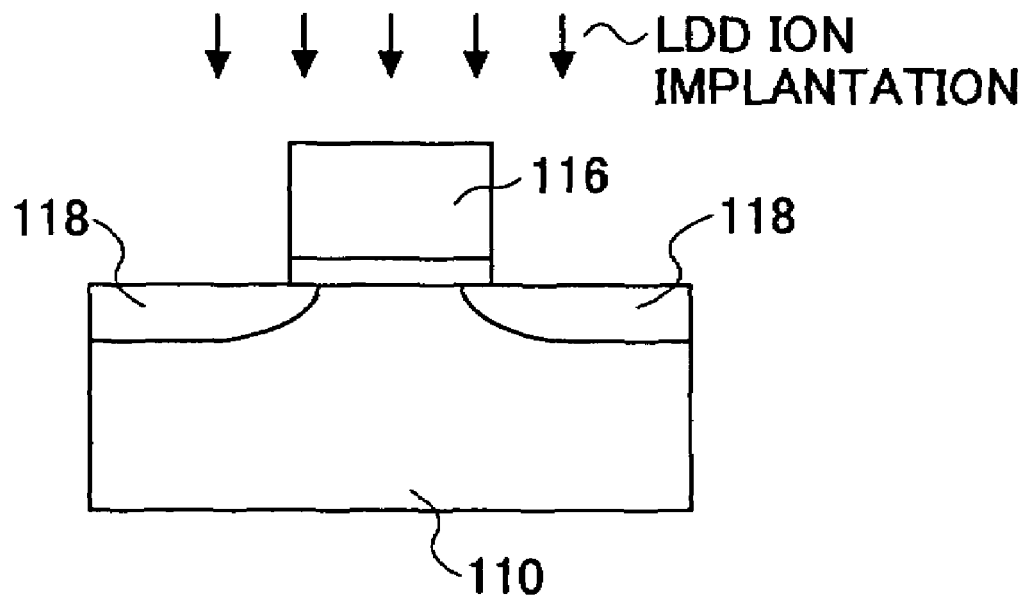
FIGS. 12A through 12D are drawings showing the process steps of producing an LDD-structure transistor.

FIGS. 11A through 11D are drawings showing the process steps of producing a single-drain-structure transistor. FIGS. 12A through 12D are drawings showing the process steps of producing a LDD-structure transistor. The process steps shown in FIGS. 11A through 11D and the process steps shown in FIGS. 12A through 11D are simultaneously performed to produce the two types of different transistor structures. It should be noted that such process steps involve no additional steps beyond the conventional sequence of process steps for producing an LDD-structure transistor.

As shown in FIG. 11A and FIG. 12A, a lightly-doped-drain ion implantation step is performed. Since the area for forming a single-drain-structure transistor is covered by an implant mask 131 (made of photoresist) as shown in FIG. 11A, no ions are implanted into the area for forming a single-drain-structure transistor. As shown in FIG. 12A, however, no implant mask is provided for the area for forming a LDD-structure transistor, so that regions that are not covered by the gate 116 receive an implant of ions. As a result, the lightly doped diffusion regions 118 are formed.

In typical CMOS processes, photoresist masks are generally used to cover a transistor of a first conductivity type while implanting ions of a second conductivity type. Some of such photoresist masks may be utilized as the implant mask 131 shown in FIG. 11A. No additional steps beyond what is conventionally performed are thus necessary to perform the lightly-doped-drain ion implantation step as described above.

Figure 12B:
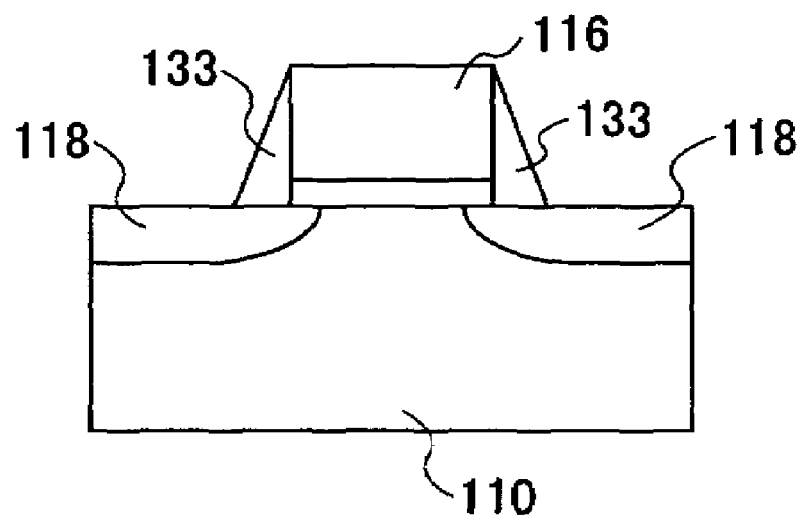

As shown in FIG. 11B and FIG. 12B, a sidewall forming step is performed. This step is typically performed by forming an oxide film through a CVD (chemical vapor deposition) method and then performing a reactive ion etching process. As a result, sidewalls 132 are formed on both sides of the gate 111 so as to cover surface areas of the substrate 110 in the proximity of the gate 111. Further, sidewalls 133 are formed on both sides of the gate 116 so as to cover part of the lightly doped diffusion regions 118 in the proximity of the gate 116.

Figure 12C:
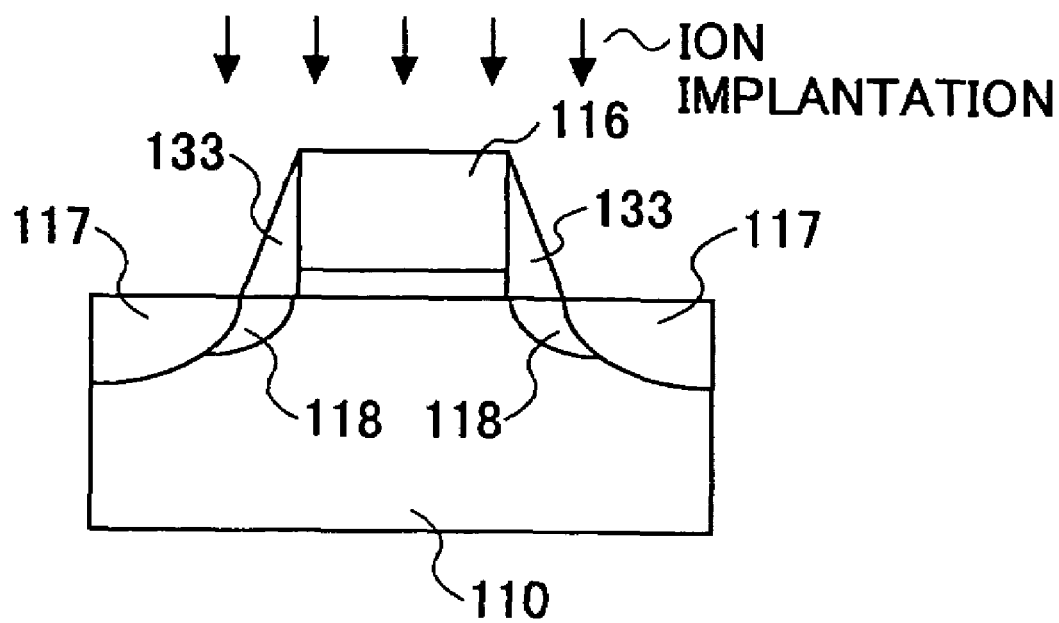

As shown in FIG. 11C and FIG. 12C, an ion implantation step for forming a heavily doped diffusion region is performed. This step implants ions at a higher dose level than that of the lightly-doped-drain ion implantation step. Through this step, the heavily doped diffusion regions 112 are formed in the substrate 110 to make a single-drain structure as shown in FIG. 1C. At the same time, the heavily doped diffusion regions 117 are formed to replace part of the lightly doped diffusion regions 118 to make a LDD structure as shown in FIG. 12C.

Figure 12D:
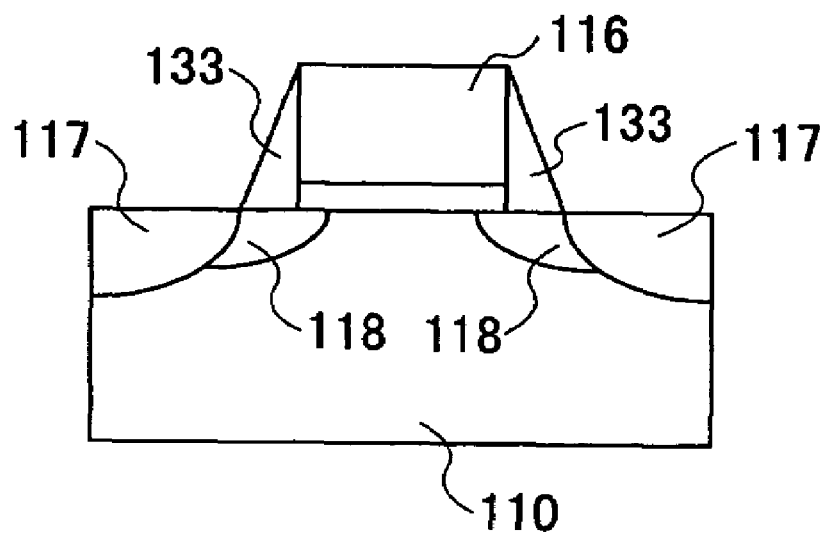

As shown in FIG. 11D and FIG. 12D, an annealing steps is performed at temperature over 700° C. to activate the impurities. Provided that the temperature is sufficiently high and the time length of the annealing process is sufficiently long, the impurity regions diffuse, so that the heavily doped diffusion regions 112 reach the edges of the gate 111 as shown in FIG. 11D.

Figure 13:
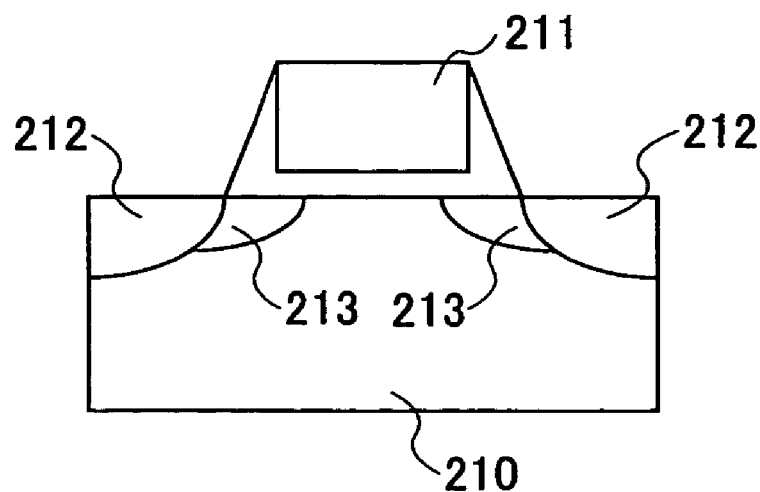
FIG. 13 is a drawing showing another example of the structure of an NMOS transistor used as a nonvolatile memory cell.
Figure 14:
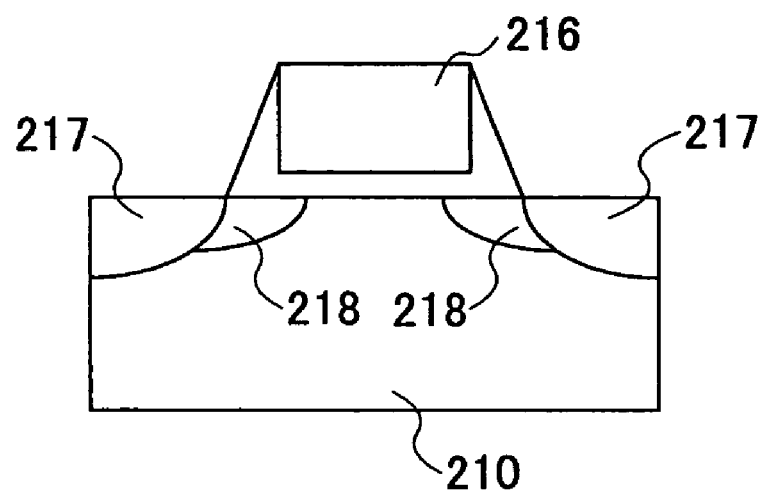
FIG. 14 is a drawing showing an example of the structure of an NMOS transistor used for purposes other than serving as a nonvolatile memory cell.

FIG. 13 is a drawing showing another example of the structure of an NMOS transistor used as a nonvolatile memory cell. FIG. 14 is a drawing showing an example of the structure of an NMOS transistor used for purposes other than serving as a nonvolatile memory cell. The structures shown in FIG. 13 and FIG. 14 are directed to a second embodiment of the present invention.

As shown in FIG. 13, an NMOS transistor used as nonvolatile memory cell is formed on a substrate 210, and includes a gate 211, heavily doped diffusion regions 212, and lightly doped diffusion regions 213. The heavily doped diffusion regions 212 have a high impurity concentration, and the lightly doped diffusion regions 213 have a low impurity concentration. An NMOS transistor having this structure is used as the NMOS transistors 51 and 52 shown in FIG. 2, i.e., as the nonvolatile memory cell transistors designed to experience the hot carrier effect.

As shown in FIG. 14, an NMOS transistor used for purposes other than serving as a nonvolatile memory cell is formed on the substrate 210, and includes a gate 216, heavily doped diffusion regions 217, and lightly doped diffusion regions 218. The heavily doped diffusion regions 217 have a high impurity concentration, and the lightly doped diffusion regions 218 have a low impurity concentration. An NMOS transistor having this structure is used as the NMOS transistors 54, 55, 56, 59, and 60 shown in FIG. 2, i.e., as the transistors that are not supposed to experience the hot carrier effect. Also, a PMOS transistor having the same structure as that shown in FIG. 14 with the opposite conductivity type is used as the PMOS transistors 53, 57, and 58 shown in FIG. 2, i.e., as the transistors that are not supposed to experience the hot carrier effect.

In the second embodiment of the present invention, the lightly doped diffusion regions 213 is designed to have an impurity concentration different from that of the lightly doped diffusion regions 218. Namely, with respect to the transistor shown in FIG. 13, a doped diffusion region (lightly doped diffusion regions 213) closest to the conduction channel (which is formed under the gate 211) has an impurity concentration different from that of the lightly doped diffusion regions 218. In general, provision is made such that the lightly doped diffusion regions 213 have a lower impurity concentration than do the lightly doped diffusion regions 218. With this provision, the ability of the lightly doped diffusion regions 213 to relax the electric field is weaker than that of the lightly doped diffusion regions 218, so that a transistor as shown in FIG. 13 is more susceptible to the hot carrier effect.

Figure 15:
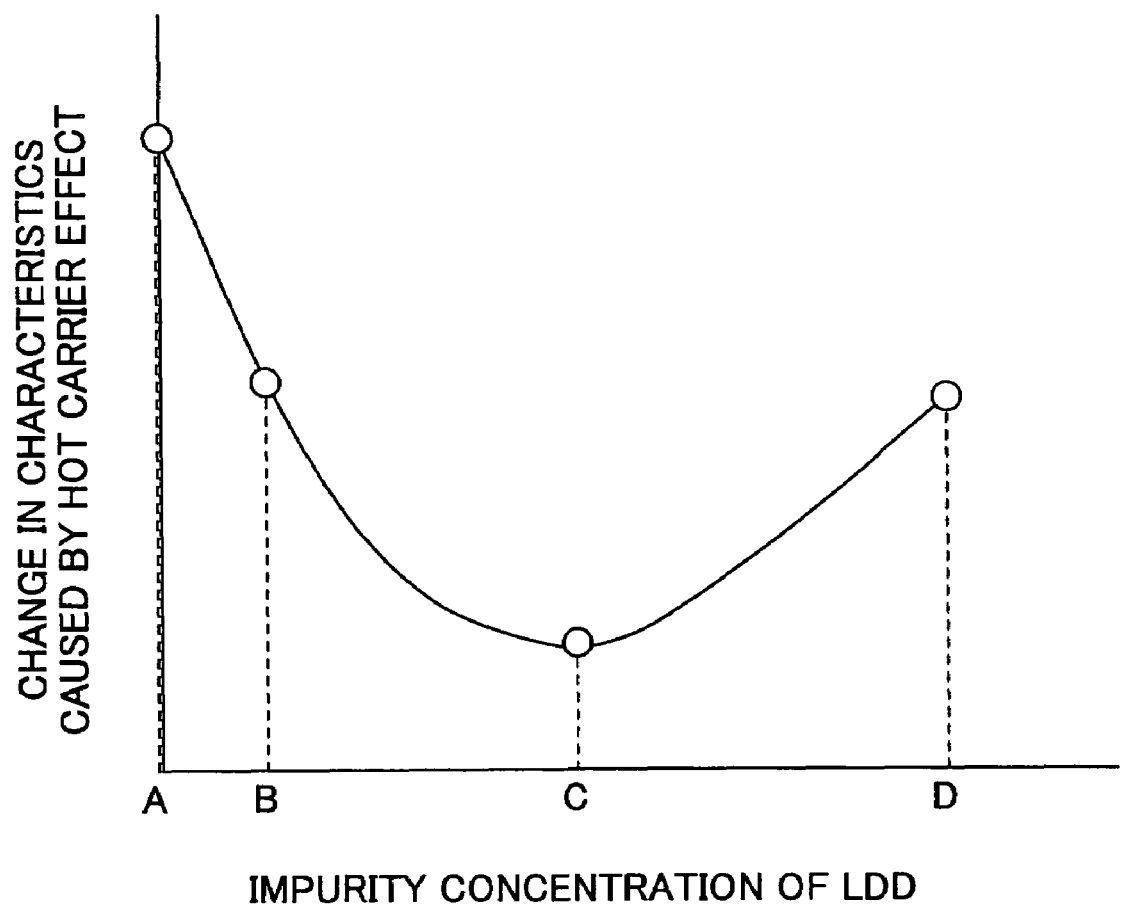
FIG. 15 is a diagram showing the relationship between the impurity concentration of lightly doped diffusion regions and a change in transistor characteristics caused by the hot carrier effect.

FIG. 15 is a diagram showing the relationship between the impurity concentration of lightly doped diffusion regions and a change in the transistor characteristics caused by the hot carrier effect. In FIG. 15, the horizontal axis represents the impurity concentration of lightly doped diffusion regions, and the vertical axis represents the amount of a change in the transistor characteristics caused by the hot carrier effect (i.e., a change in the threshold voltage).

An impurity concentration C is the optimum concentration of lightly doped diffusion regions that achieves the lowest hot-carrier effect. In general, transistors used in circuitry are designed to have this optimum concentration. Accordingly, the transistors 53 through 60 shown in FIG. 2 having the structure as shown in FIG. 14 may have such optimum concentration.

As can be seen from FIG. 15, within the range between an impurity concentration A and the optimum impurity concentration C, the lower the impurity concentration, the larger the amount of a change in the transistor characteristics is. Accordingly, the lightly doped diffusion regions 213 having a lower impurity concentration (such as B shown in FIG. 15) than the lightly doped diffusion regions 218 (C shown in FIG. 15) ensures that the transistor shown in FIG. 13 exhibits a larger change in the threshold voltage than the transistor shown in FIG. 14, provided that all things are equal, except for the above-described impurity concentration.

As can be seen from FIG. 15, further, within the range between the optimum impurity concentration A and an impurity concentration D, the higher the impurity concentration, the larger the amount of a change in the transistor characteristics is. Accordingly, the lightly doped diffusion regions 213 having a higher impurity concentration (such as D shown in FIG. 15) than the lightly doped diffusion regions 218 (C shown in FIG. 15) ensures that the transistor shown in FIG. 13 exhibits a larger change in the threshold voltage than the transistor shown in FIG. 14, provided that all things are equal, except for the above-described impurity concentration.

FIGS. 16A through 16E are drawings showing the process steps of producing an LLD-structure transistor. FIGS. 17A through 17E are drawings showing the process steps of producing an LDD-structure transistor having a different impurity concentration of the lightly doped diffusion regions than the LDD-structure transistor shown in FIGS. 16A through 16E. The process steps shown in FIGS. 16A through 16E and the process steps shown in FIGS. 17A through 17E are simultaneously performed to produce the two types of transistors.

Figure 16A:
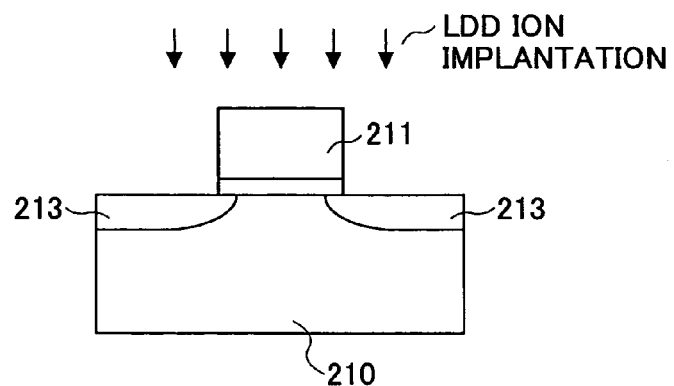
FIGS. 16A through 16E are drawings showing the process steps of producing an LLD-structure transistor.
Figure 17A:
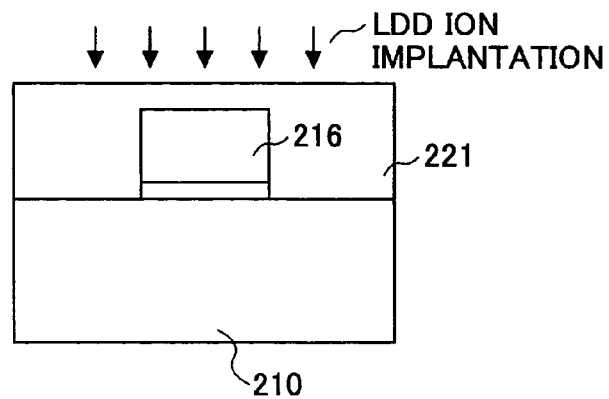
FIGS. 17A through 17E are drawings showing the process steps of producing an LDD-structure transistor having a different impurity concentration in the lightly doped diffusion regions than the LDD-structure transistor shown in FIGS. 16A through 16E.

As shown in FIG. 16A and FIG. 17A, a first lightly-doped-drain ion implantation step is performed. Since the area for forming a transistor in FIG. 17A is covered by an implant mask 221 (made of photoresist), no ions are implanted into the area for forming this transistor. On the other hand, no implant mask is provided for the area for forming a transistor in FIG. 16A, so that regions that are not covered by the gate 211 receive an implant of ions. As a result, the lightly doped diffusion regions 213 are formed.

Figure 16B:
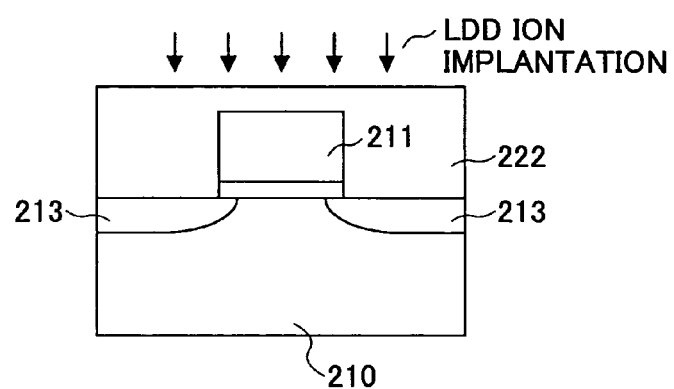
Figure 17B:
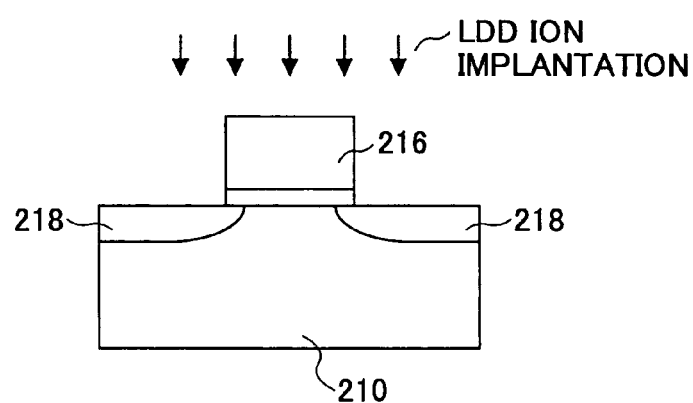

As shown in FIG. 16B and FIG. 17B, a second lightly-doped-drain ion implantation step is performed. Since the area for forming a transistor in FIG. 16B is covered by an implant mask 222 (made of photoresist), no ions are implanted into the area for forming this transistor. On the other hand, no implant mask is provided for the area for forming a transistor in FIG. 17B, so that regions that are not covered by the gate 216 receive an implant of ions. As a result, the lightly doped diffusion regions 218 are formed.

It should be noted that the first lightly-coped drain ion implantation step and the second lightly-coped drain ion implantation step are performed to implant ions at different dose levels. This arrangement ensures that the two resulting transistors have different characteristics as to the susceptibility to the hot carrier effect.

Figure 16C:
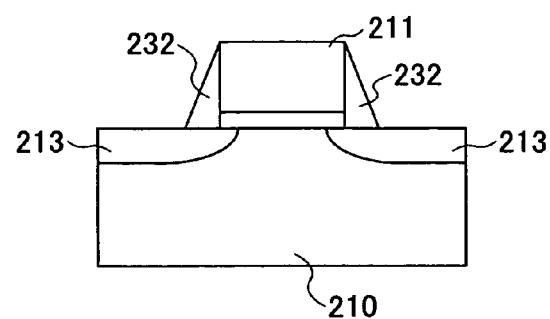
Figure 17C:
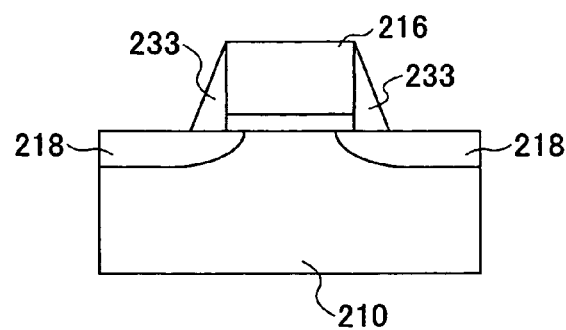

As shown in FIG. 16C and FIG. 17C, a sidewall forming step is performed. This step is typically performed by forming an oxide film through a CVD (chemical vapor deposition) method and then performing a reactive ion etching process. As a result, sidewalls 232 are formed on both sides of the gate 211 so as to cover part of the lightly doped diffusion regions 213 in the proximity of the gate 211. Further, sidewalls 233 are formed on both sides of the gate 216 so as to cover part of the lightly doped diffusion regions 218 in the proximity of the gate 216.

Figure 16D:
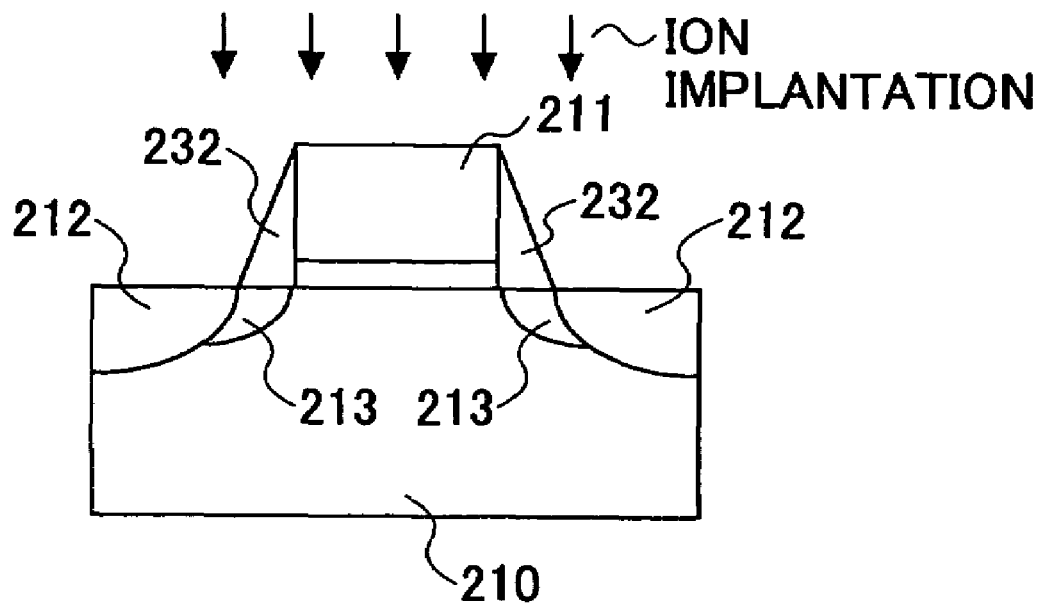
Figure 17D:
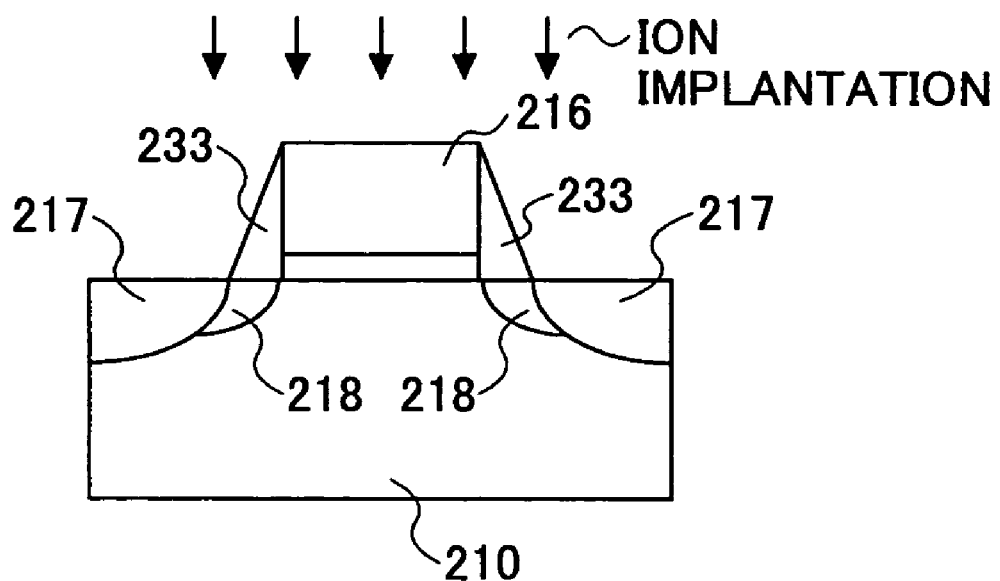

As shown in FIG. 16D and FIG. 17D, an ion implantation step for forming a heavily doped diffusion region is performed. This step implants ions at a higher dose level than that of the first and second lightly-doped-drain ion implantation steps. Through this step, the heavily doped diffusion regions 212 are formed to replace part of the lightly doped diffusion regions 213 to make a LDD structure as shown in FIG. 16D. At the same time, the heavily doped diffusion regions 217 are formed to replace part of the lightly doped diffusion regions 218 to make a LDD structure as shown in FIG. 17D.

Figure 16E:
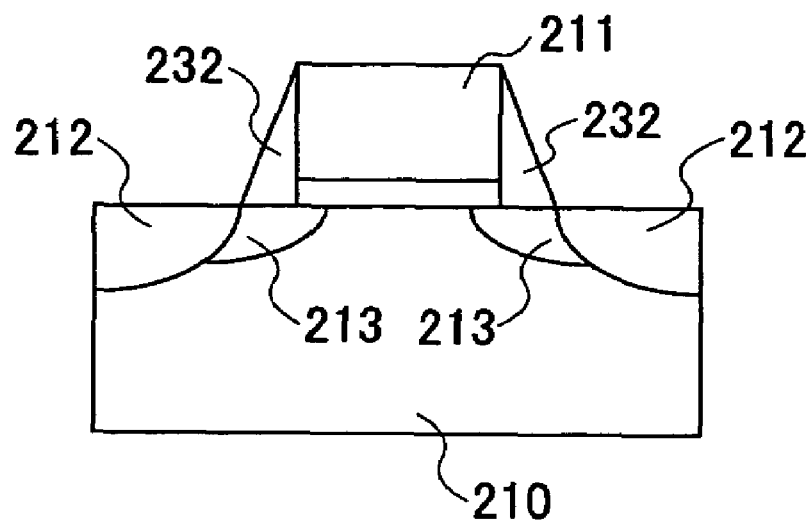
Figure 17E:
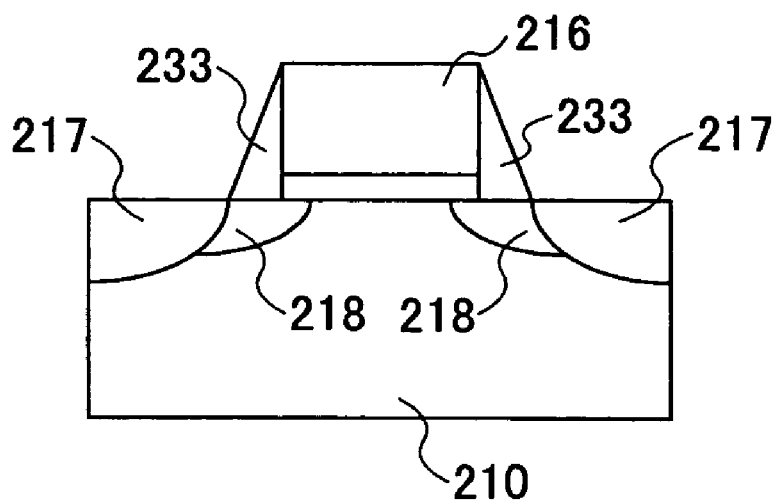

As shown in FIG. 16E and FIG. 17E, an annealing steps is performed at temperature over 700° C. to activate the impurities. In the first embodiment shown in FIGS. 11A through 11D and FIGS. 12A through 12D, the annealing temperature needs to be sufficiently high and the time length of the annealing process also needs to be sufficiently long, in order for the heavily doped diffusion regions 112 to reach the edges of the gate 111 as shown in FIG. 11D. If the temperature and/or time length are not sufficient, a gap may be created between the heavily doped diffusion regions 112 and the gate 111, i.e., between the source/drain regions and the channel. In the second embodiment shown in FIGS. 16A through 16E and FIGS. 17A through 17E, on the other hand, such gap between the source/drain regions and the channel may never develop even if the annealing temperature and/or time are not sufficient.

Figure 18:
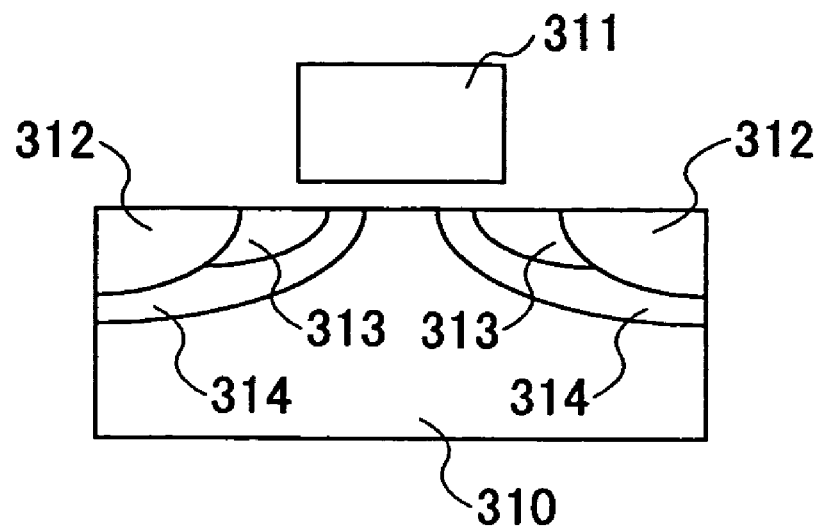
FIG. 18 is a drawing showing another example of the structure of an NMOS transistor used as a nonvolatile memory cell.
Figure 19:
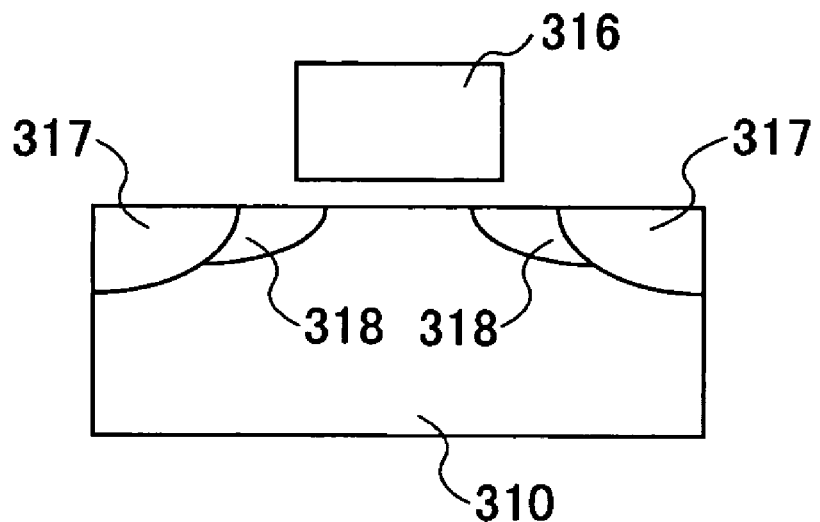
FIG. 19 is a drawing showing an example of the structure of an NMOS transistor used for purposes other than serving as a nonvolatile memory cell.

FIG. 18 is a drawing showing another example of the structure of an NMOS transistor used as a nonvolatile memory cell. FIG. 19 is a drawing showing an example of the structure of an NMOS transistor used for purposes other than serving as a nonvolatile memory cell. The structures shown in FIG. 18 and FIG. 19 are directed to a third embodiment of the present invention.

As shown in FIG. 18, an NMOS transistor used as nonvolatile memory cell is formed on a substrate 310, and includes a gate 311, heavily doped diffusion regions 312, first lightly doped diffusion regions 313, and second lightly doped diffusion regions 314. The heavily doped diffusion regions 312 have a high impurity concentration, and the first and second lightly doped diffusion regions 313 and 314 have a low impurity concentration. The first lightly doped diffusion regions 313 are of a first conductivity type, and the second lightly doped diffusion regions 314 are of a second conductivity type opposite the first conductivity type. In the case of an NMOS transistor, thus, the second lightly doped diffusion regions 314 are p-type diffusion regions while the first lightly doped diffusion regions 313 are n-type diffusion regions. In this case, further, the substrate 310 is of a p-type, and the heavily doped diffusion regions 312 are of an n-type. An NMOS transistor having the structure shown in FIG. 18 is used as the NMOS transistors 51 and 52 shown in FIG. 2, i.e., as the nonvolatile memory cell transistors designed to experience the hot carrier effect.

As shown in FIG. 19, an NMOS transistor used for purposes other than serving as a nonvolatile memory cell is formed on the substrate 310, and includes a gate 316, heavily doped diffusion regions 317, and lightly doped diffusion regions 318. The heavily doped diffusion regions 317 have a high impurity concentration, and the lightly doped diffusion regions 318 have a low impurity concentration. An NMOS transistor having this structure is used as the NMOS transistors 54, 55, 56, 59, and 60 shown in FIG. 2, i.e., as the transistors that are not supposed to experience the hot carrier effect. Also, a PMOS transistor having the same structure as that shown in FIG. 19 with the opposite conductivity type is used as the PMOS transistors 53, 57, and 58 shown in FIG. 2, i.e., as the transistors that are not supposed to experience the hot carrier effect.

Figure 20:
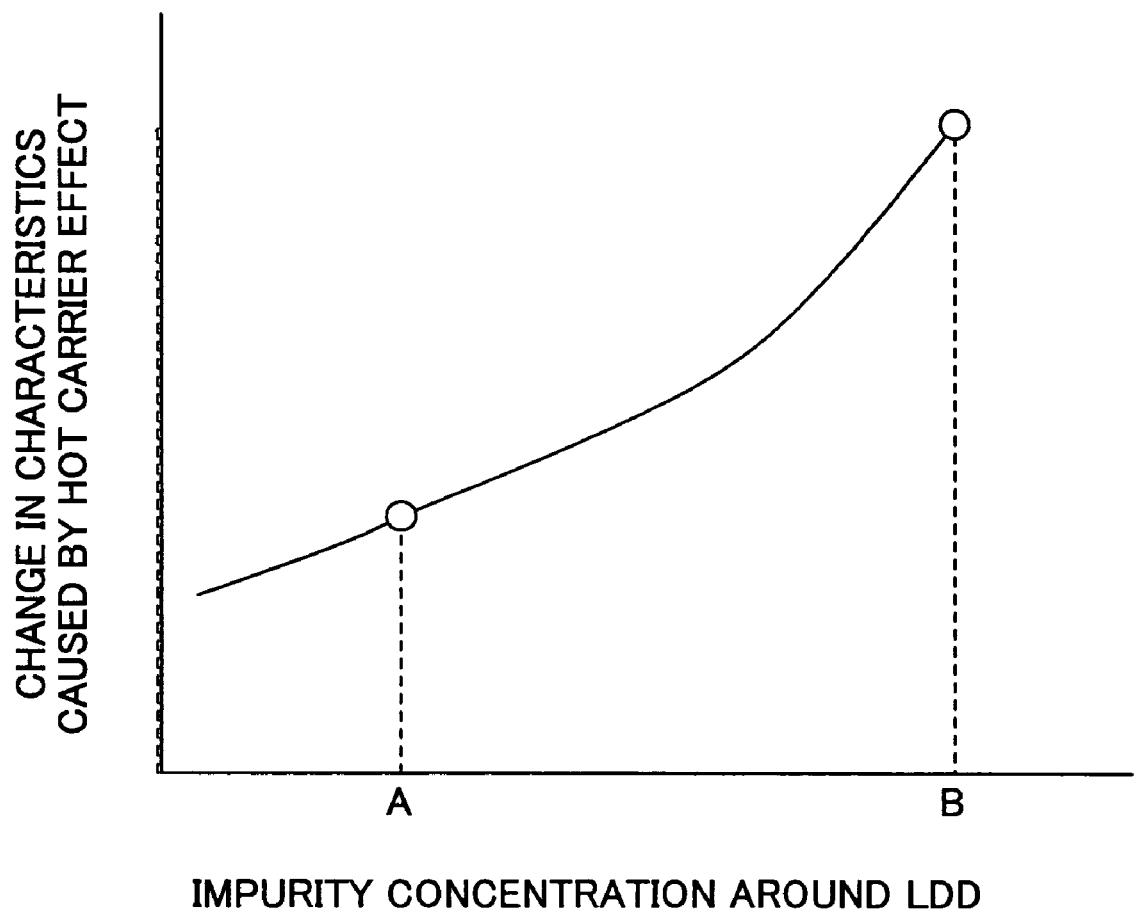
FIG. 20 is a diagram showing the relationship between the impurity concentration around lightly doped diffusion regions and a change in transistor characteristics caused by the hot carrier effect.

FIG. 20 is a diagram showing the relationship between the impurity concentration around lightly doped diffusion regions and a change in the transistor characteristics caused by the hot carrier effect. In FIG. 20, the horizontal axis represents the impurity concentration around the lightly doped diffusion regions (i.e., the first lightly doped diffusion regions 313 shown in FIG. 18). That is, the horizontal axis represents the impurity concentration of the second lightly doped diffusion regions 314. The vertical axis represents the amount of a change in the transistor characteristics caused by the hot carrier effect (i.e., a change in the threshold voltage).

As can be seen from FIG. 20, the higher the impurity concentration of the second lightly doped diffusion regions 314, the larger the amount of a change in the transistor characteristics is. This is because generated hot carriers are efficiently injected into the sidewall spacers. Accordingly, the second lightly doped diffusion regions 314 having a higher impurity concentration (such as B shown in FIG. 20) than the substrate 310 (such as A shown in FIG. 20) ensures that the transistor shown in FIG. 18 exhibits a larger change in the threshold voltage than the transistor shown in FIG. 19, provided that all things are equal, except for the above-described impurity concentration. It should be noted that, with respect to the transistor shown in FIG. 18, a doped diffusion region (second lightly doped diffusion regions 314) closest to the conduction channel (which is formed under the gate 311) has a conductivity type opposite to that of the lightly doped diffusion regions 318.

FIGS. 21A through 21F are drawings showing the process steps of producing a transistor having the structure as shown in FIG. 18. FIGS. 22A through 22F are drawings showing the process steps of producing a transistor having the LDD structure as shown in FIG. 19. The process steps shown in FIGS. 21A through 21F and the process steps shown in FIGS. 22A through 22F are simultaneously performed to produce the two types of transistors.

Figure 21A:
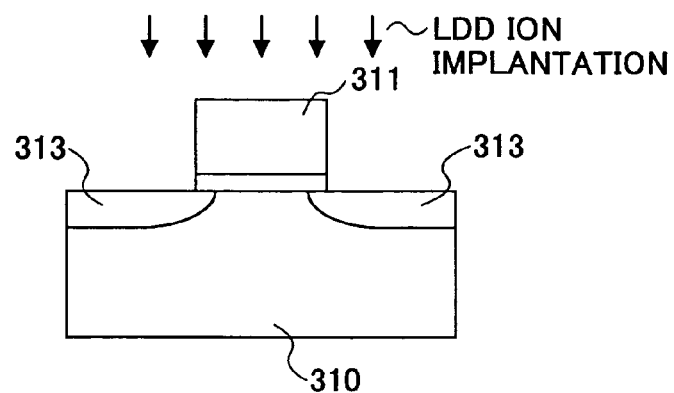
FIGS. 21A through 21F are drawings showing the process steps of producing a transistor having the structure as shown in FIG. 18.
Figure 22A:
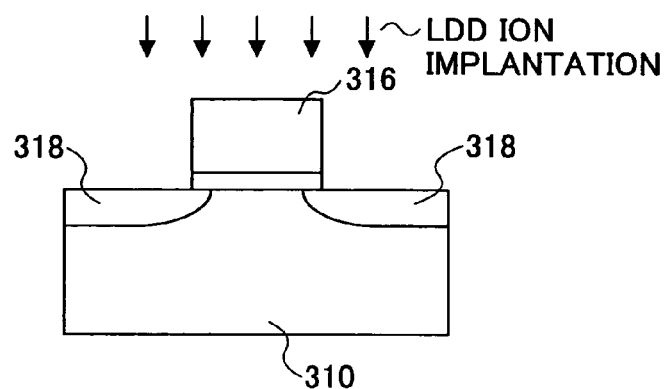
FIGS. 22A through 22F are drawings showing the process steps of producing a transistor having the LDD structure as shown in FIG. 19.

As shown in FIG. 21A and FIG. 22A, a first lightly-doped-drain ion implantation step is performed. This forms the first lightly doped diffusion regions 313 as shown in FIG. 21A and the lightly doped diffusion regions 318 as shown in FIG. 22A.

Figure 21B:
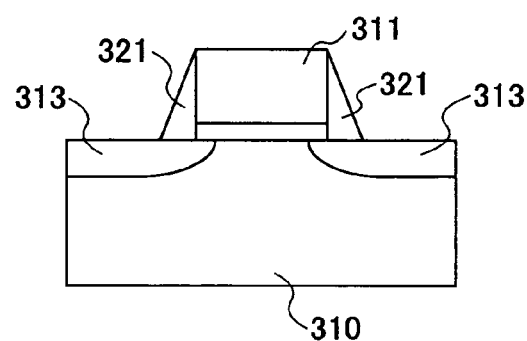
Figure 22B:
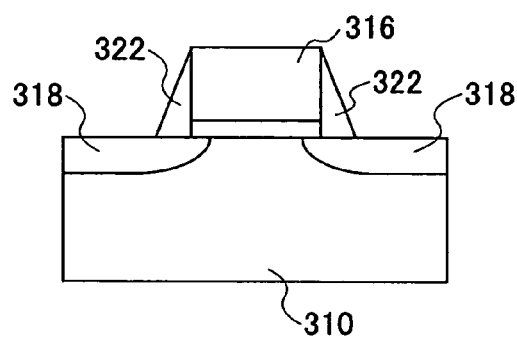

As shown in FIG. 21B and FIG. 22B, a sidewall forming step is performed. This step is typically performed by forming an oxide film through a CVD (chemical vapor deposition) method and then performing a reactive ion etching process. As a result, sidewalls 321 are formed as shown in FIG. 21B, and sidewalls 322 are formed as shown in FIG. 22B.

Figure 21C:
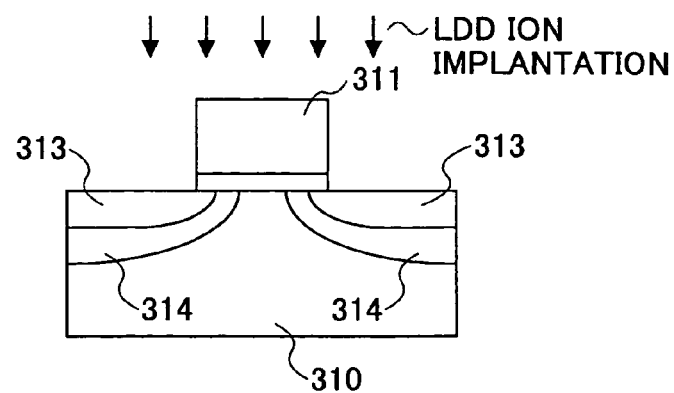
Figure 22C:
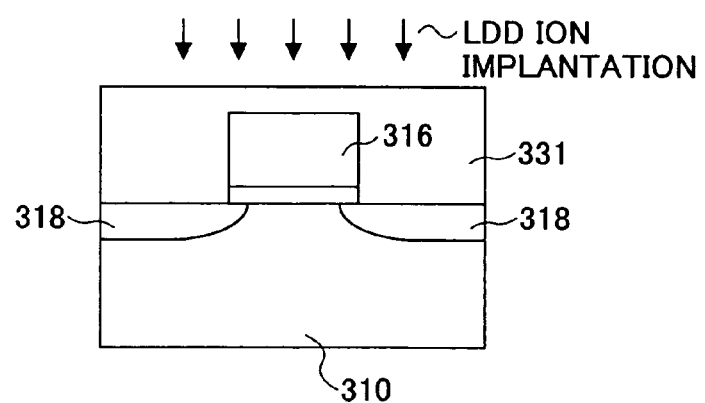

As shown in FIG. 21C and FIG. 22C, a second lightly-doped-drain ion implantation step is performed. Since the area for forming a transistor in FIG. 22C is covered by an implant mask 331 (made of photoresist), no ions are implanted into the area for forming this transistor. On the other hand, no implant mask is provided for the area for forming a transistor in FIG. 21C, so that regions that are not covered by the gate 311 receive an implant of ions. As a result, the lightly doped diffusion regions 314 are formed.

It should be noted that the first lightly-coped drain ion implantation step and the second lightly-coped drain ion implantation step are performed to implant ions of respective, different conductivity types.

Figure 21D:
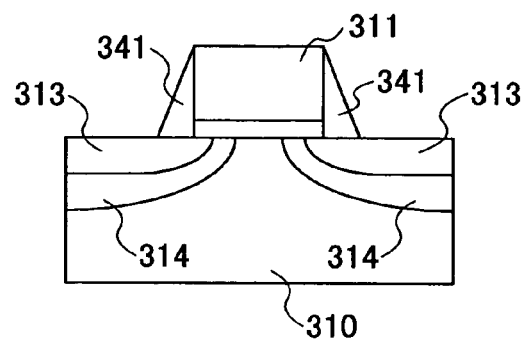
Figure 22D:
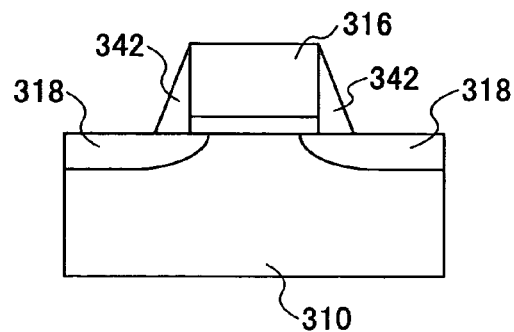

As shown in FIG. 21D and FIG. 22D, a sidewall forming step is performed. This step is typically performed by forming an oxide film through a CVD (chemical vapor deposition) method and then performing a reactive ion etching process. As a result, sidewalls 341 are formed as shown in FIG. 21D, and sidewalls 342 are formed as shown in FIG. 22D.

Figure 21E:
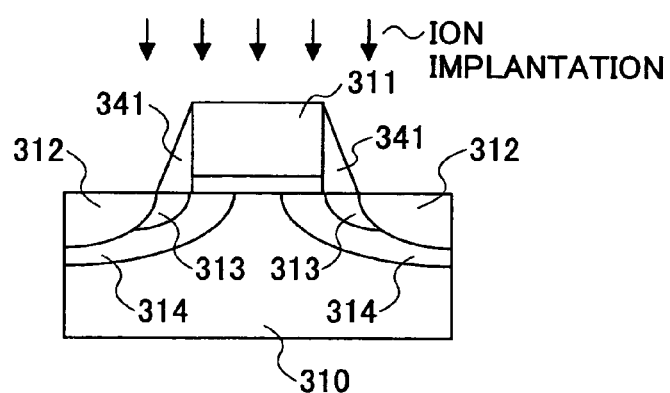
Figure 22E:
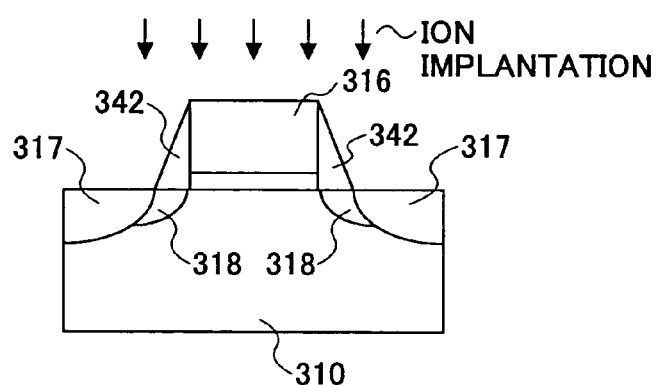

As shown in FIG. 21E and FIG. 22E, an ion implantation step for forming a heavily doped diffusion region is performed. This step implants ions at a higher dose level than that of the first and second lightly-doped-drain ion implantation steps. Through this step, the heavily doped diffusion regions 312 are formed to replace part of the lightly doped diffusion regions 313 as shown in FIG. 21E. At the same time, the heavily doped diffusion regions 317 are formed to replace part of the lightly doped diffusion regions 318 to make a LDD structure as shown in FIG. 22E.

Figure 21F:
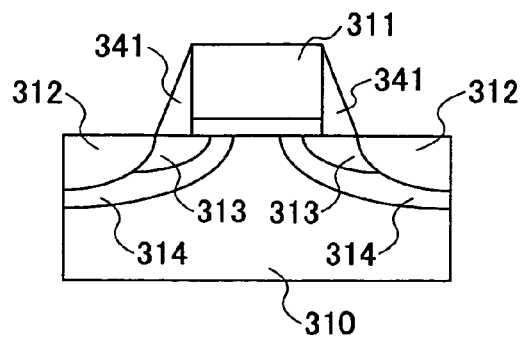
Figure 22F:
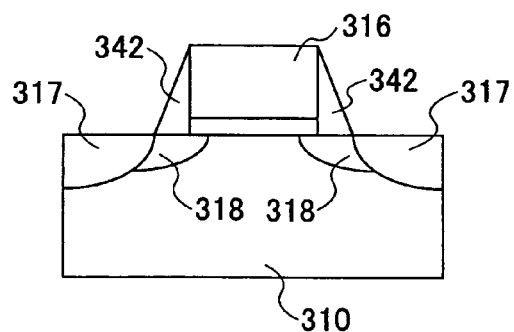

As shown in FIG. 21F and FIG. 22F, an annealing steps is performed at temperature over 700° C. to activate the impurities. The annealing temperature needs to be sufficiently high and the time length of the annealing process also needs to be sufficiently long. If the temperature and/or time length are not sufficient, a gap may be created between the source/drain regions and the channel.

Further, the present invention is not limited to these embodiments, but various variations and modifications may be made without departing from the scope of the present invention.

What is claimed is:

1. A memory circuit, comprising:
   a latch including MIS transistors, said latch having a first node and a second node configured to be bi-stable with a potential of the first node inverse to a potential of the second node;
   a first MIS transistor operable to electrically couple between the first node of said latch and a predetermined node;
   a second MIS transistor operable to electrically couple between the second node of said latch and said predetermined node; and
   a control circuit configured to subject, in a first operation mode, one of said first MIS transistor and said second MIS transistor to bias conditions that cause a lingering change in transistor characteristics thereof, and to cause, in a second operation mode, said latch to store data responsive to the lingering change in the transistor characteristics,
   wherein at least one of the MIS transistors of the latch that is of a same conductivity type as the first and second MIS transistors has a lightly-doped-drain structure that includes first diffusion regions having a first impurity concentration and second diffusion regions having a second impurity concentration smaller than the first impurity concentration, and each of the first MIS transistor and the second MIS transistor has a doped diffusion region closest to a conduction channel such that the doped diffusion region has an impurity concentration different from the second impurity concentration or a conductivity type opposite to that of the second diffusion regions.

2. The memory circuit as claimed in claim 1, wherein each of the first MIS transistor and the second MIS transistor has a single-drain structure, and the doped diffusion region closest to the conduction channel is a drain of each of the first MIS transistor and the second MIS transistor.

3. The memory circuit as claimed in claim 2, wherein the drain of each of the first MIS transistor and the second MIS transistor has the first impurity concentration.

4. The memory circuit as claimed in claim 1, wherein each of the first MIS transistor and the second MIS transistor has a lightly-doped-drain structure that includes third diffusion regions having a third impurity concentration and fourth diffusion regions having a fourth impurity concentration smaller than the third impurity concentration, and the doped diffusion region closest to the conduction channel is one of the fourth diffusion regions.

5. The memory circuit as claimed in claim 4, wherein the third impurity concentration is identical to the first impurity concentration.

6. The memory circuit as claimed in claim 1, wherein each of the first MIS transistor and the second MIS transistor has a drain structure that includes third diffusion regions having a third impurity concentration, fourth diffusion regions having a fourth impurity concentration smaller than the third impurity concentration, and fifth diffusion regions of a conductivity type opposite to that of the fourth diffusion regions, and the doped diffusion region closest to the conduction channel is one of the fifth diffusion regions.

7. The memory circuit as claimed in claim 6, wherein the third impurity concentration is identical to the first impurity concentration, and the fourth impurity concentration is identical to the second impurity concentration.

8. A semiconductor memory device, comprising:
   a control circuit;
   word lines extending from said control circuit;
   word selecting lines extending from said control circuit;
   a plurality of memory units arranged in a matrix, one of said memory units coupled to a first bit line and a second bit line, said one of said memory units including:
   a latch including MIS transistors, said latch having a first node and a second node configured to be bi-stable with a potential of the first node inverse to a potential of the second node;
   a first MIS transistor having one of source/drain nodes thereof coupled to the first node of said latch, another one of the source/drain nodes thereof coupled to a predetermined node, and a gate node thereof coupled to said word selecting line;
   a second MIS transistor having one of source/drain nodes thereof coupled to the second node of said latch, another one of the source/drain nodes thereof coupled to said predetermined node, and a gate node thereof coupled to said word selecting line;
   a third transistor having a gate thereof coupled to one of said word lines and source/drain nodes thereof coupled to the first node and the first bit line, respectively; and
   a fourth transistor having a gate thereof coupled to said one of said word lines and source/drain nodes thereof coupled to the second node and the second bit line, respectively,
   wherein said control circuit of configured to subject, in a first operation mode, one of said first MIS transistor and said second MIS transistor to bias conditions that cause a lingering change in transistor characteristics thereof, and to cause, in a second operation mode, said latch to store data responsive to the lingering change in the transistor characteristics,
   and wherein at least one of the MIS transistors of the latch that is of a same conductivity type as the first and second MIS transistors has a lightly-doped-drain structure that includes first diffusion regions having a first impurity concentration and second diffusion regions having a second impurity concentration smaller than the first impurity concentration, and each of the first MIS transistor and the second MIS transistor has a doped diffusion region closest to a conduction channel such that the doped diffusion region has an impurity concentration different from the second impurity concentration or a conductivity type opposite to that of the second diffusion regions.

9. The semiconductor memory device as claimed in claim 8, wherein each of the first MIS transistor and the second MIS transistor has a single-drain structure, and the doped diffusion region closest to the conduction channel is a drain of each of the first MIS transistor and the second MIS transistor.

10. The semiconductor memory device as claimed in claim 9, wherein the drain of each of the first MIS transistor and the second MIS transistor has the first impurity concentration.

11. The semiconductor memory device as claimed in claim 8, wherein each of the first MIS transistor and the second MIS transistor has a lightly-doped-drain structure that includes third diffusion regions having a third impurity concentration and fourth diffusion regions having a fourth impurity concentration smaller than the third impurity concentration, and the doped diffusion region closest to the conduction channel is one of the fourth diffusion regions.

12. The semiconductor memory device as claimed in claim 11, wherein the third impurity concentration is identical to the first impurity concentration.

13. The semiconductor memory device as claimed in claim 8, wherein each of the first MIS transistor and the second MIS transistor has a drain structure that includes third diffusion regions having a third impurity concentration, fourth diffusion regions having a fourth impurity concentration smaller than the third impurity concentration, and fifth diffusion regions of a conductivity type opposite to that of the fourth diffusion regions, and the doped diffusion region closest to the conduction channel is one of the fifth diffusion regions.

14. The semiconductor memory device as claimed in claim 13, wherein the third impurity concentration is identical to the first impurity concentration, and the fourth impurity concentration is identical to the second impurity concentration.

* * * * *